(12) United States Patent
Botula et al.

(10) Patent No.: US 8,008,142 B2
(45) Date of Patent: Aug. 30, 2011

(54) SELF-ALIGNED SCHOTTKY DIODE

(75) Inventors: Alan B. Botula, Essex Junction, VT (US); Alvin J. Joseph, Williston, VT (US); Alan D. Norris, Hinesburg, VT (US); Robert M. Rassel, Colchester, VT (US); Yun Shi, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/538,213

(22) Filed: Aug. 10, 2009

(65) Prior Publication Data
US 2010/0230751 A1 Sep. 16, 2010

Related U.S. Application Data

(60) Provisional application No. 61/159,816, filed on Mar. 13, 2009.

(51) Int. Cl.
*H01L 21/338* (2006.01)
(52) U.S. Cl. ........ 438/167; 438/151; 438/177; 438/570; 438/571; 257/E21.409; 257/E21.45
(58) Field of Classification Search .................. 438/167, 438/177, 180, 181, 184, 185, 570, 571, 576, 438/581, 583; 257/E21.409, E21.45
See application file for complete search history.

(56) References Cited

U.S. PATENT DOCUMENTS

| | | | |
|---|---|---|---|
| 5,629,544 A * | 5/1997 | Voldman et al. | 257/355 |
| 6,353,251 B1 * | 3/2002 | Kimura | 257/473 |
| 6,876,067 B2 | 4/2005 | Arai et al. | |
| 7,250,666 B2 | 7/2007 | Nowak | |
| 2006/0091490 A1 * | 5/2006 | Chen et al. | 257/458 |
| 2007/0052057 A1 | 3/2007 | Drobny | |
| 2007/0108518 A1 | 5/2007 | Endo et al. | |
| 2007/0108534 A1 * | 5/2007 | Nowak | 257/382 |
| 2007/0184594 A1 | 8/2007 | Nowak | |

OTHER PUBLICATIONS

S.I. Cha et al., "Novel Schottky Diode With Selfaligned Guard Ring", Electronics Letters, Jun. 18, 1992, pp. 1221-1223, vol. 28, No. 13.

(Continued)

*Primary Examiner* — Angel Roman
(74) *Attorney, Agent, or Firm* — Scully, Scott, Murphy & Presser, P.C.; Anthony J. Canale

(57) ABSTRACT

A Schottky barrier diode comprises a doped guard ring having a doping of a second conductivity type in a semiconductor-on-insulator (SOI) substrate. The Schottky barrier diode further comprises a first-conductivity-type-doped semiconductor region having a doping of a first conductivity type, which is the opposite of the second conductivity type, on one side of a dummy gate electrode and a Schottky barrier structure surrounded by the doped guard ring on the other side. A Schottky barrier region may be laterally surrounded by the dummy gate electrode and the doped guard ring. The doped guard ring includes an unmetallized portion of a gate-side second-conductivity-type-doped semiconductor region having a doping of a second conductivity type. A Schottky barrier region may be laterally surrounded by a doped guard ring including a gate-side doped semiconductor region and a STI-side doped semiconductor region. Design structures for the inventive Schottky barrier diode are also provided.

19 Claims, 19 Drawing Sheets

OTHER PUBLICATIONS

C.T. Chuang et al., "A Schottky-Barrier Diode with Self-Aligned Floating Guard Ring", IEEE Transactions on Electron Devices, Oct. 1984, vol. ED-31, No. 10.

Bor Wen Liou et al., "High Breakdown Voltage Schottky Barrier Diode Using P+-Polycrystalline Silicon Diffused Guard Ring", Oct. 26, 1995, pp. 1950-1951, vol. 31, No. 22.

K. Matsuura et al., "Metal-gate, Schottky-source/drain SOI-MOSFET for complementary integration" (Abstract only), Transactions of the Institute of Electrical Engineers of Japan, pp. 499-508, Mar. 2001, vol. 121-C, No. 3.

\* cited by examiner

SELF-ALIGNED SCHOTTKY DIODE

Applicant claims the benefit of Provisional Application Ser. No. 61/159,816, Self-Aligned Schottky Diode, filed on Mar. 13, 2009.

FIELD OF THE INVENTION

The present invention relates to semiconductor structures, and more particularly to semiconductor structures including a self-aligned Schottky diode, and methods of manufacturing the same.

BACKGROUND OF THE INVENTION

Diodes are employed in analog, mixed signal, and radio frequency (RF) semiconductor circuits for various purposes including power applications and wireless applications. A typical vertical p-n junction diode employs a vertical p-n junction formed by implantation of opposite types of dopants at different implantation depths. A typical Schottky barrier diode employs a vertical metal semiconductor junction that provides rectifying characteristics such as a junction between a metal silicide and a doped silicon portion. Vertical p-n junction diodes and Schottky barrier diodes are typically formed in a bulk semiconductor substrate since formation of a vertical p-n junction or a vertical Schottky barrier requires control of thicknesses of two different materials.

Formation of such diodes in a semiconductor-on-insulator (SOI) substrate poses a challenge since the thickness of a top semiconductor layer tends to be insufficient to allow formation of two vertical layers with precise thickness control. As the thickness of the top semiconductor layer decreases below 100 nm, and in many cases below 50 nm, implementation of conventional vertical diode such as a p-n junction diode and Schottky barrier diode becomes impractical due to the difficulty of forming a vertical junction in the top semiconductor layer. Further, shallow trench isolation structures in an SOI substrate contacts a buried insulator layer, and consequently, contact to a lower terminal of a vertical diode becomes difficult.

In addition, a Schottky barrier diode requires a doped guard ring to prevent excessive leakage current. Standard source/drain ion implantation, which may be employed to form a doped guard ring in a bulk substrate, does not provide an adequate structure for a doped guard ring since dopants from standard source/drain implantation reaches to the buried insulator layer in the case of the SOI substrate. Thus, no adequate method is provided for formation of a doped guard ring in an SOI substrate according to prior art methods.

In view of the above, there exists a need for a diode that may be manufactured in an SOI substrate despite a limited thickness of a top semiconductor layer, and methods of manufacturing the same.

Particularly, there exists a need for a Schottky barrier diode that may be manufacture in the SOI substrate with a functional doped guard ring to prevent excessive leakage current from the Schottky diode to the top semiconductor layer, and methods of manufacturing the same.

SUMMARY OF THE INVENTION

The present invention provides a Schottky diode in a semiconductor-on-insulator substrate having a doped guard ring that is self-aligned to an edge of a Schottky barrier region, and methods of manufacturing the same.

In the present invention, a Schottky barrier diode includes a doped guard ring having a doping of a second conductivity type in a semiconductor-on-insulator (SOI) substrate. The Schottky barrier diode further includes a first-conductivity-type-doped semiconductor region having a doping of a first conductivity type, which is the opposite of the second conductivity type, on one side of a dummy gate electrode and a Schottky barrier structure surrounded by the doped guard ring on the other side. A Schottky barrier region may be laterally surrounded by the dummy gate electrode and the doped guard ring. The doped guard ring includes an unmetallized portion of a gate-side second-conductivity-type-doped semiconductor region having a doping of a second conductivity type. A Schottky barrier region may be laterally surrounded by a doped guard ring including a gate-side doped semiconductor region and a STI-side doped semiconductor region. Design structures for the inventive Schottky barrier diode are also provided.

A first-conductivity-type-doped semiconductor region is formed on one side of a dummy gate electrode. An angled ion implantation is employed to form a gate-side second-conductivity-type-doped semiconductor region which is self-aligned to an edge of the dummy gate electrode on the other side. In one embodiment, a Schottky barrier region laterally surrounded by the dummy gate electrode and an annular second-conductivity-type-doped guard ring is formed. The annular second-conductivity-type-doped guard ring includes an unmetallized portion of the gate-side second-conductivity-type-doped semiconductor region. In another embodiment, an STI-side second-conductivity-type-doped semiconductor region is formed along a boundary between a top semiconductor layer and a shallow trench isolation structure by ion implantation. After formation of a Schottky barrier region, the gate-side second-conductivity-type-doped semiconductor region and the STI-side second-conductivity-type-doped semiconductor region collectively constitute a second-conductivity-type-doped guard ring.

According to an aspect of the present invention, a method of forming a semiconductor structure is provided, which includes: forming an overlying structure on a first-conductivity-type-doped semiconductor material portion; forming a second-conductivity-type-doped semiconductor region self-aligned to a sidewall of the overlying structure; and converting a portion of the second-conductivity-type-doped semiconductor region to a metal semiconductor alloy portion, wherein the metal semiconductor alloy portion abuts the first-conductivity-type-doped semiconductor material portion to form a Schottky barrier, wherein the metal semiconductor alloy portion is laterally abutted and surrounded by an unreacted remaining portion of the second-conductivity-type-doped semiconductor region.

According to another aspect of the present invention, another method of forming a semiconductor structure is provided, which includes: forming an overlying structure on a first-conductivity-type-doped semiconductor material portion; forming a gate-side second-conductivity-type-doped semiconductor region self-aligned to a sidewall of the overlying structure; forming a shallow trench isolation-side (STI-side) second-conductivity-type-doped semiconductor region abutting sidewalls of a shallow trench isolation (STI) structure and directly adjoined to the gate-side second-conductivity-type-doped semiconductor region in the first-conductivity-type-doped semiconductor material portion; and converting a portion of the gate-side second-conductivity-type-doped semiconductor region and a portion of the STI-side second-conductivity-type-doped semiconductor region to a metal semiconductor alloy portion, wherein the metal semiconductor alloy portion abuts the first-conductivity-type-doped semiconductor material portion to form a Schottky barrier.

According to even another aspect of the present invention, a semiconductor structure is provided, which includes: an overlying structure located on a first-conductivity-type-doped semiconductor material portion having a doping of a first conductivity type in a substrate; a second-conductivity-type-doped semiconductor region having a doping of a second conductivity type self-aligned to a sidewall of the overlying structure, wherein the second conductivity type is the opposite of the first conductivity type; and a horizontal Schottky barrier located between a metal semiconductor alloy portion and the first-conductivity-type-doped semiconductor material portion, wherein the second-conductivity-type-doped semiconductor region laterally abuts and laterally surrounds the metal semiconductor alloy portion.

According to yet another aspect of the present invention, another semiconductor structure is provided, which includes: an overlying structure located on a first-conductivity-type-doped semiconductor material portion having a doping of a first conductivity type of a substrate; a gate-side second-conductivity-type-doped semiconductor region having a doping of a second conductivity type self-aligned to a sidewall of the overlying structure, wherein the second conductivity type is the opposite of the first conductivity type; a shallow trench isolation-side (STI-side) second-conductivity-type-doped semiconductor region having a doping of said second conductivity type abutting sidewalls of a shallow trench isolation (STI) structure in the substrate and directly adjoined to the gate-side second-conductivity-type-doped semiconductor region; and a horizontal Schottky barrier between a metal semiconductor alloy portion and the first-conductivity-type-doped semiconductor material portion, wherein the metal semiconductor alloy portion abuts the gate-side second-conductivity-type-doped semiconductor region and the STI-side second-conductivity-type-doped semiconductor region.

According to still another aspect of the present invention, a design structure embodied in a machine readable medium for designing, manufacturing, or testing a design is provided. The design structure includes: a first data representing a first-conductivity-type-doped semiconductor material portion having a doping of a first conductivity type in a substrate; a second data representing an overlying structure located on the first-conductivity-type-doped semiconductor material portion; a third data representing a second-conductivity-type-doped semiconductor region having a doping of a second conductivity type which is self-aligned to a sidewall of the overlying structure, wherein the second conductivity type is the opposite of the first conductivity type; a fourth data representing a metal semiconductor alloy portion horizontally abutting the first-conductivity-type-doped semiconductor material portion; and a fifth data representing a horizontal Schottky barrier located between the metal semiconductor alloy portion and the first-conductivity-type-doped semiconductor material portion, wherein the second-conductivity-type-doped semiconductor region laterally abuts and laterally surrounds the metal semiconductor alloy portion.

According to a further aspect of the present invention, another design structure embodied in a machine readable medium for designing, manufacturing, or testing a design is provided. The design structure includes: a first data representing a first-conductivity-type-doped semiconductor material portion having a doping of a first conductivity type in a substrate; a second data representing an overlying structure located on the first-conductivity-type-doped semiconductor material portion; a third data representing a gate-side second-conductivity-type-doped semiconductor region having a doping of a second conductivity type which is self-aligned to a sidewall of the overlying structure, wherein said second conductivity type is the opposite of said first conductivity type; a fourth data representing a shallow trench isolation-side (STI-side) second-conductivity-type-doped semiconductor region having a doping of said second conductivity type abutting sidewalls of a shallow trench isolation (STI) structure in the substrate and directly adjoined to the gate-side second-conductivity-type-doped semiconductor region; a fourth data representing a metal semiconductor alloy portion horizontally abutting the first-conductivity-type-doped semiconductor material portion; and a fifth data representing a horizontal Schottky barrier located between the metal semiconductor alloy portion and the first-conductivity-type-doped semiconductor material portion, wherein the metal semiconductor alloy portion abuts the gate-side second-conductivity-type-doped semiconductor region and the STI-side second-conductivity-type-doped semiconductor region.

BRIEF DESCRIPTION OF THE DRAWINGS

FIG. 1 corresponds to a step of implantation of dopants into a top semiconductor layer 30 of a semiconductor-on-insulator (SOI) substrate. FIG. 2 corresponds to a step after formation of a gate stack including a gate dielectric 40 and a gate conductor portion 42 as an overlying structure and a dielectric spacer 44. FIG. 3 corresponds to a step of formation of a gate-side second-conductivity-type-doped semiconductor region having a doping of a second conductivity type 34. FIG. 4 corresponds to a step of formation of a first-conductivity-type-doped semiconductor region 36 having a doping of a first conductivity type. FIG. 5A corresponds to a step of formation of a shallow trench isolation-side (STI-side) second-conductivity-type-doped semiconductor region having a doping of the second conductivity type 38. FIG. 6 corresponds to a step after formation of a first metal semiconductor alloy portion 64, a second metal semiconductor alloy portion 66, and a gate metal semiconductor alloy portion 62. FIG. 7 corresponds to a step after formation of a middle-of-line (MOL) dielectric layer 80, a first contact via 84, and a second contact via 86.

FIG. 8A corresponds to a step after formation of an overlying structure (40, 42, 44I, 44O). FIG. 9A corresponds to a step of formation of a second-conductivity-type-doped semiconductor region having a doping of a second conductivity type 35. FIG. 10A corresponds to a step of formation of an first-conductivity-type-doped semiconductor region 36. FIG. 11A corresponds to a step after formation of a first metal semiconductor alloy portion 64, a second metal semiconductor alloy portion 66, and a gate metal semiconductor alloy portion 62. FIG. 12A corresponds to a step after formation of a middle-of-line (MOL) dielectric layer 80, a first contact via 84, and a second contact via 86.

DETAILED DESCRIPTION OF THE INVENTION

Figure 1:
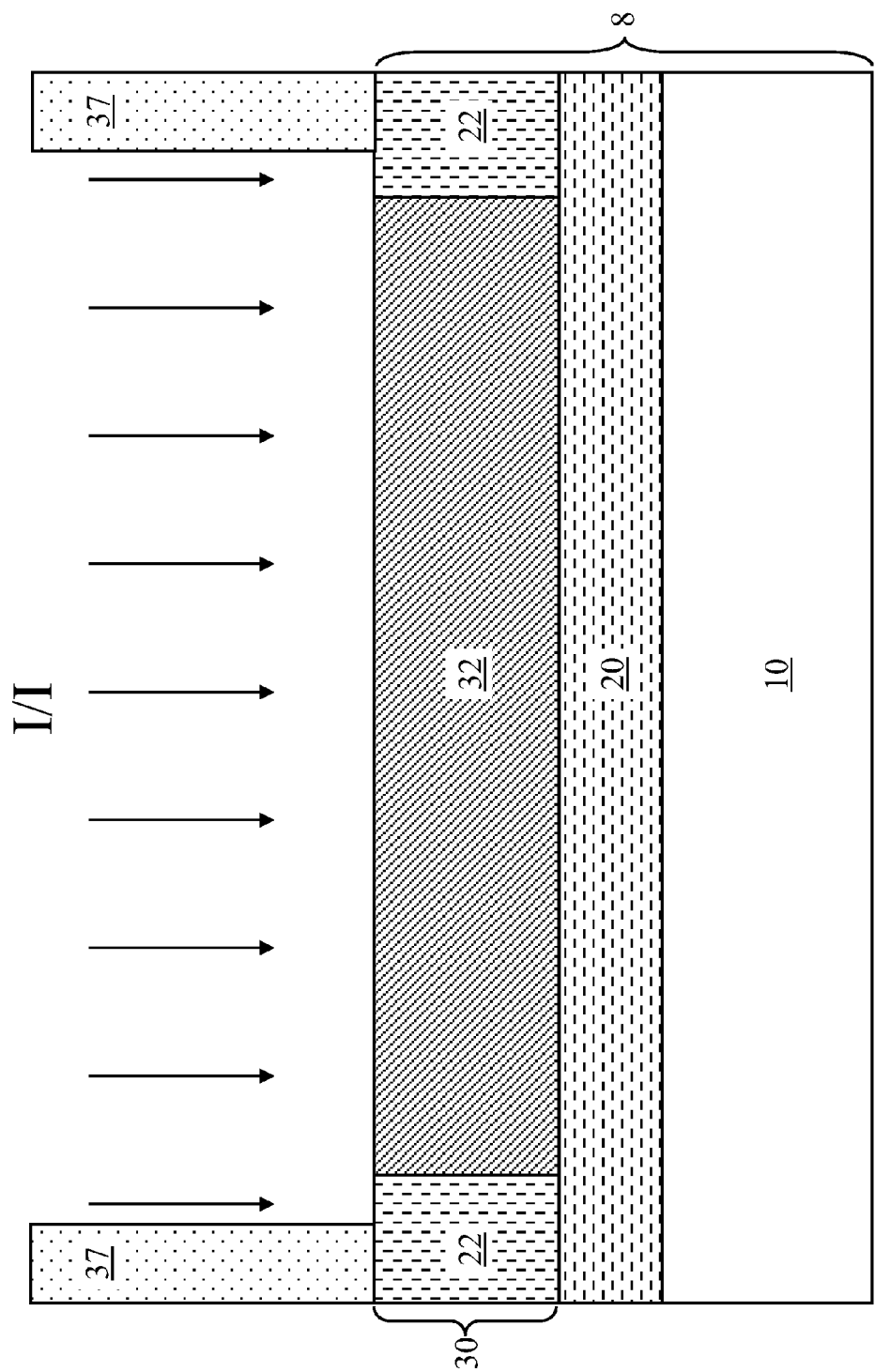
FIGS. 1-4, 5A, 6, and 7 are sequential vertical cross-sectional views of a first exemplary semiconductor structure according to a first embodiment of the present invention.

As stated above, the present invention relates to semiconductor structures including a self-aligned Schottky diode, and design structures for the same. Throughout the drawings, the same reference numerals or letters are used to designate like or equivalent elements. The drawings are not necessarily drawn to scale.

Referring to FIG. 1, a first exemplary semiconductor structure according to a first embodiment of the present invention includes a semiconductor substrate 8, which is a semiconductor-on-insulator (SOI) substrate that includes a handle substrate 10, a buried insulator layer 20, and a top semiconductor layer 30. The top semiconductor layer 30 includes a first-conductivity-type-doped semiconductor material portion 32 having a doping of a first conductivity type and a shallow trench isolation structure 22 including a dielectric material. The first conductivity type may be p-type or n-type. The thickness of the top semiconductor layer 30 may be from about 20 nm to about 300 nm, and typically from about 40 nm to about 150 nm, although lesser and greater thicknesses are also contemplated herein. The thickness of the buried insulator layer may be from about 50 nm to about 600 nm, and typically from about 100 nm to about 300 nm, although lesser and greater thicknesses are also contemplated herein.

The shallow trench isolation structure 22 is formed, for example, by formation of a dielectric pad layer (not shown) over the semiconductor substrate 8, application and lithographic patterning of a photoresist (not shown), an anisotropic etch that transfers the pattern in the photoresist into exposed portions of the top semiconductor layer 30 to form shallow trenches, deposition of a dielectric material inside the shallow trench, and planarization of the dielectric material. Preferably, the depth of the shallow trench isolation structure 22 is at least the thickness of the top semiconductor layer 30 so that the first-conductivity-type-doped semiconductor material portion 32 is completely laterally surrounded by the shallow trench isolation structure 22. The combination of the shallow trench isolation structure 22 and the buried insulator layer 20 provides electrical isolation to the first-conductivity-type-doped semiconductor material portion 32.

The first-conductivity-type-doped semiconductor material portion 32 includes a semiconductor material having the first-conductivity-type doping. Non-limiting examples of semiconductor materials that may be employed for the first-conductivity-type-doped semiconductor material portion 32 include silicon, a silicon germanium alloy portion, silicon, germanium, a silicon-germanium alloy portion, a silicon carbon alloy portion, a silicon-germanium-carbon alloy portion, gallium arsenide, indium arsenide, indium gallium arsenide, indium phosphide, lead sulfide, other III-V compound semiconductor materials, and II-VI compound semiconductor materials. For example, silicon may be employed for the semiconductor material of the first-conductivity-type-doped semiconductor material portion 32. Preferably, the first-conductivity-type-doped semiconductor material portion 32 is single crystalline, i.e., the semiconductor material is epitaxially aligned atomically within the entirety of the first-conductivity-type-doped semiconductor material portion 32.

The first-conductivity-type-doped semiconductor material portion 32 may be formed by providing an SOI substrate 8 containing a top semiconductor layer 30 having the first-conductivity-type doping. Alternately, the first-conductivity-type-doped semiconductor material portion 32 may be formed by implanting first-conductivity-type dopants into a portion of a top semiconductor layer 30 by ion implantation of first-conductivity-type dopants. In case the top semiconductor layer 30 includes an intrinsic semiconductor material or a doped semiconductor material, a block level photoresist 37 may be applied over the top surface of the top semiconductor layer 30 and lithographically patterned to form an opening, into which first-conductivity-type dopants are implanted to form the first-conductivity-type-doped semiconductor material portion 32. The direction of first-conductivity-type dopant ions implanted into exposed portions of the top semiconductor layer 30 is schematically represented by arrows labeled I/I. The block level photoresist 37 may be removed after the masked ion implantation. The first-conductivity-type-doped semiconductor material portion 32 has a first dopant concentration, which may be from about $1.0 \times 10^{15}/cm^3$ to about $1.0 \times 10^{19}/cm^3$, and typically from about $1.0 \times 10^{16}/cm^3$ to about $1.0 \times 10^{18}/cm^3$, although lesser and greater first dopant concentrations are contemplated herein also.

While the present invention is described with a semiconductor-on-insulator (SOI) substrate, the present invention may also be practiced on a bulk substrate or a hybrid substrate including a bulk portion and a semiconductor-on-insulator (SOI) portion. Such variations are explicitly contemplated herein.

Figure 2:
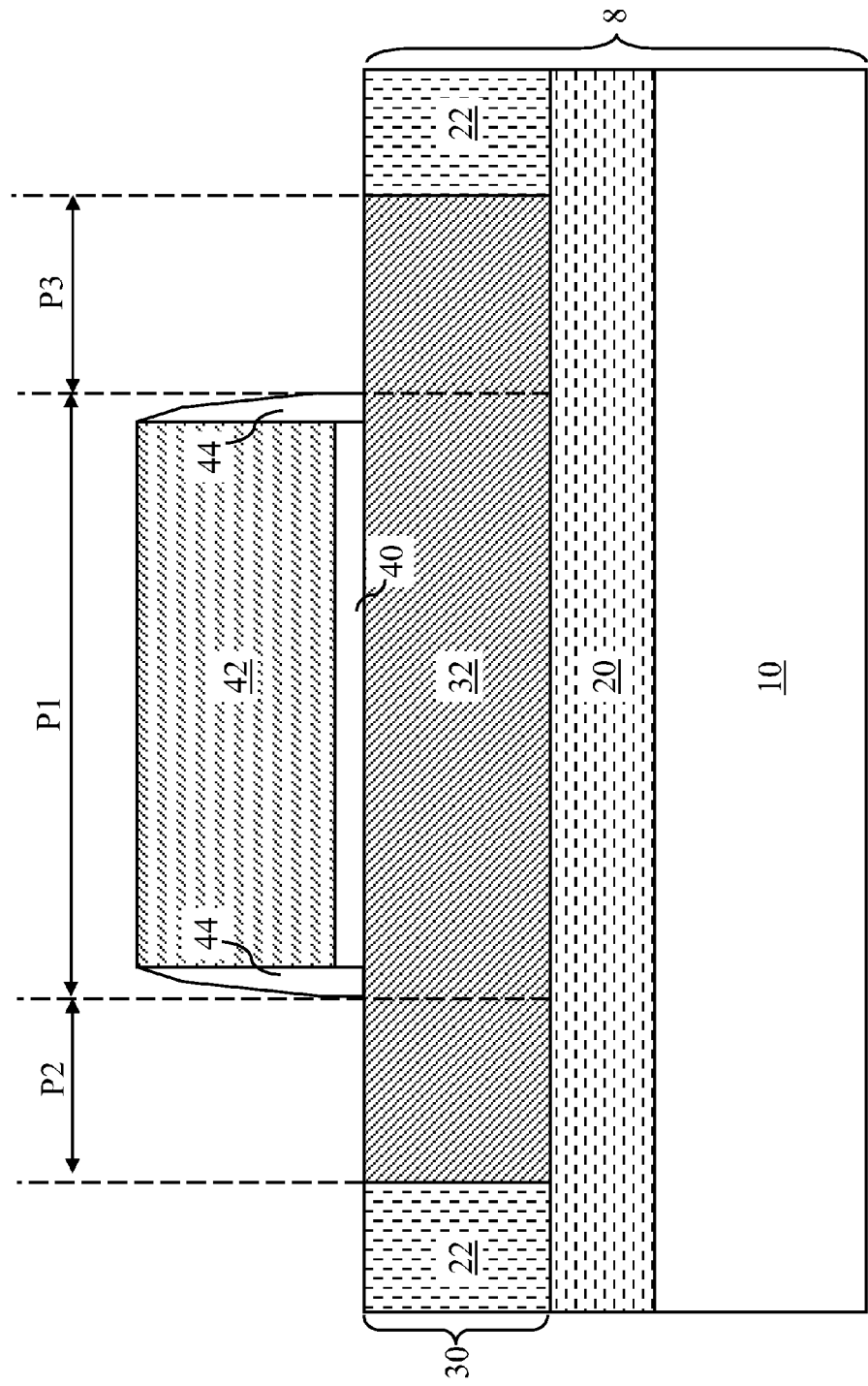

Referring to FIG. 2, an overlying structure that may be employed as an implantation mask is formed on a top surface of the first-conductivity-type-doped semiconductor material portion 32. For example, the overlying structure may include a vertical stack of a gate dielectric 40 and a gate conductor portion 42. The gate dielectric 40 includes a dielectric material, which may be a silicon-oxide based dielectric material or a metal-oxide-containing dielectric material having a dielectric constant greater than 8.0. The gate conductor portion 42 includes a conductive material such as a doped semiconductor material or a metallic material.

The vertical stack of the gate dielectric 40 and the gate conductor portion 42 may be formed by deposition of a gate dielectric layer (not shown) and a gate conductor layer (not shown) followed by application and lithographic patterning of a photoresist (not shown) and transfer of the pattern in the photoresist into the stack of the gate conductor layer and the gate dielectric layer by an anisotropic etch such as a reactive ion etch. The vertical stack of the gate dielectric and the gate conductor portion 42 may be formed simultaneously with formation of gate electrodes (not shown) of field effect transistors (not shown) that are formed on the top semiconductor layer 30. The sidewalls of the gate conductor portion 42 and the sidewalls of the gate dielectric 40 are substantially vertically coincident.

A dielectric spacer 44 is formed on the sidewalls of the vertical stack of the gate dielectric 40 and the gate conductor portion 42. The dielectric spacer 44 is formed by methods known in the art, i.e., deposition of a conformal dielectric layer (not shown) and an anisotropic etch that remove horizontal portions of the conformal dielectric layer. The remaining vertical portion of the conformal dielectric layer constitutes the dielectric spacer 44. The dielectric spacer 44 laterally surrounds the vertical stack of the gate dielectric 40 and the gate conductor portion 42. The dielectric spacer 44 is of unitary construction, i.e., in one piece, and laterally abuts and laterally surrounds the vertical stack of the gate dielectric 40 and the gate conductor portion 42, or any overlying structure that may be employed instead.

Preferably, the thickness of the vertical stack of the gate dielectric 40 and the gate conductor portion 42 is greater than the thickness of the top semiconductor layer 30 so that a complete shielding may be provided to the portion of the first-conductivity-type-doped semiconductor material portion 32 underneath the overlying structure during subsequent ion implantation. The thickness of the vertical stack of the gate dielectric 40 and the gate conductor portion 42 is primarily determined by the thickness of the gate conductor portion 42, and may be from about 40 nm to about 300 nm, and typically from about 60 nm to about 200 nm, although lesser and greater thicknesses are also contemplated herein.

The vertical stack of the gate dielectric 40 and the gate conductor portion 42 divides the first-conductivity-type-doped semiconductor material portion 32 into three portions: a first portion P1 underlying the vertical stack of the gate dielectric 40 and the gate conductor portion 42, a second portion P2 not underlying the vertical stack of the gate dielectric 40 and the gate conductor portion 42 and located on one side of the vertical stack, and a third portion P3 not underlying the vertical stack of the gate dielectric 40 and the gate conductor portion 42 and located on the other side of the vertical stack. The third portion P3 is separated from the second portion P2 by the first portion P1, i.e., the third portion P3 does not abut the second portion P2.

While the present invention is described with the vertical stack of the gate dielectric 40 and the gate conductor portion 42 as the overlying structure, the present invention may be practiced with any other overlying structure that may be employed as an implantation mask. Such variations are explicitly contemplated herein.

Figure 3:
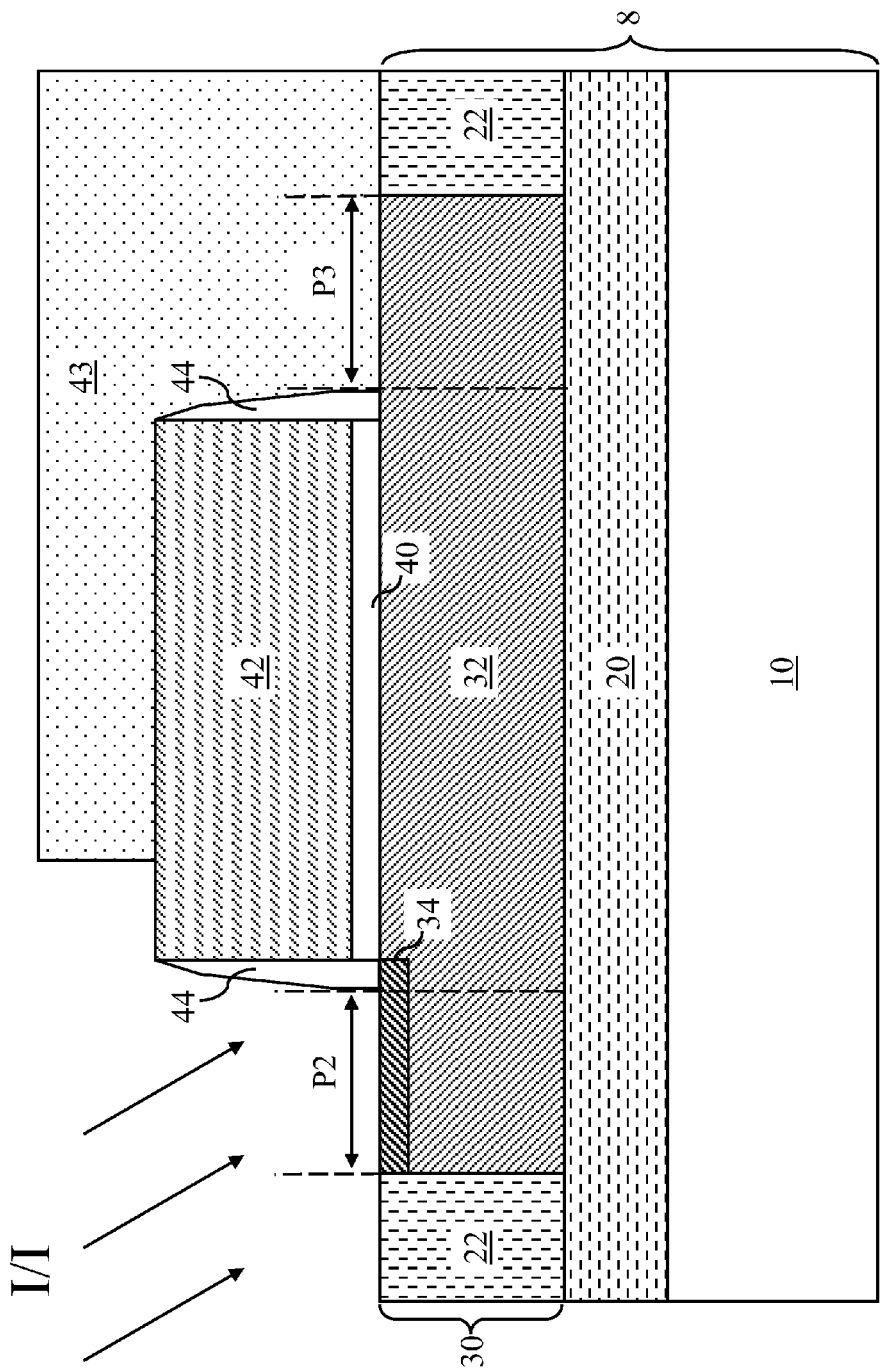

Referring to FIG. 3, a first photoresist 43 is applied over the overlying structure (40, 42, 44) and the top semiconductor layer 30, and is lithographically patterned to expose the second portion P2 of the first-conductivity-type-doped semiconductor material portion 32, while covering the third portion P3 of the first-conductivity-type-doped semiconductor material portion 32. An edge of the first photoresist 43 overlies a top surface of the overlying structure (40, 42, 44) after the lithographic patterning.

Second-conductivity-type dopants are implanted into the first-conductivity-type-doped semiconductor material portion 32 by angled ion implantation to form a gate-side second-conductivity-type-doped semiconductor region having a doping of a second conductivity type 34 employing the first photoresist 43 and the overlying structure (40, 42, 44) as implantation masks. The second conductivity type is the opposite of the first conductivity type. If the first conductivity type is p-type, the second conductivity type is n-type, and vice versa. The gate-side second-conductivity-type-doped semiconductor region 34 is formed by conversion of a top portion of the second portion P2 of the first-conductivity-type-doped semiconductor material portion 32 and an adjoining portion of the first-conductivity-type-doped semiconductor material portion 32 underneath an edge of the overlying structure (40, 42, 44) into a second-conductivity-type-doped semiconductor region having a doping of the second conductivity type. Specifically, the dose of the ion implantation is selected so that second-conductivity-type dopants have a higher concentration than first-conductivity-type dopants in the gate-side second-conductivity-type-doped semiconductor region 34. The net dopant concentration, i.e., the difference between the dopant concentration of second-conductivity-type dopants and the dopant concentration of first-conductivity-type dopants, of the gate-side second-conductivity-type-doped semiconductor region 34 may be from about $1.0 \times 10^{18}/cm^3$ to about $1.0 \times 10^{21}/cm^3$, and typically from about $1.0 \times 10^{19}/cm^3$ to about $5.0 \times 10^{20}/cm^3$, although lesser and greater first dopant concentrations are contemplated herein also.

The thickness of the gate-side second-conductivity-type-doped semiconductor region 34 is less than the thickness of the top semiconductor layer 30, i.e., the thickness of the portion of the first-conductivity-type-doped semiconductor material portion 32 vertically abutting the overlying structure (40, 42, 44). The thickness of the gate-side second-conductivity-type-doped semiconductor region 34 may be from about 5 nm to about 100 nm, and typically from about 10 nm to about 40 nm, although lesser and greater thicknesses are also contemplated herein.

The angle of the ion implantation is selected such that a portion of the gate-side second-conductivity-type-doped semiconductor region 34 underlies an edge portion of the overlying structure (40, 42, 44). The gate-side second-conductivity-type-doped semiconductor region 34 is self aligned to an outer sidewall of the overlying structure (40, 42, 44) with a lateral offset. The lateral offset is determined by the energy of ion implantation, the angle of the ion implantation, the species of the implanted ions, etc. For example, the gate-side second-conductivity-type-doped semiconductor region 34 may underlie the dielectric spacer 44. In case the overlying structure (40, 42, 44) includes a vertical stack of the gate dielectric 40 and the gate conductor portion 42, the gate-side second-conductivity-type-doped semiconductor region 34 may be self-aligned to sidewalls of the vertical stack of the gate dielectric 40 and the gate conductor portion 42 with a lateral offset. The gate-side second-conductivity-type-doped semiconductor region 34 may, or may not, underlie the gate dielectric 40 depending on the lateral offset of the gate-side second-conductivity-type-doped semiconductor region 34 from the outer sidewall of the overlying structure (40, 42, 44) or from the sidewalls of the vertical stack of the gate dielectric 40 and the gate conductor portion 42. The first photoresist 43 is subsequently removed.

The formation of the gate-side second-conductivity-type-doped semiconductor region 34 may be performed simultaneously with the formation of source/drain extension regions for second-conductivity-type field effect transistors employing the same ion implantation step and the same implantation mask. Therefore, no additional ion implantation step is required for formation of the gate-side second-conductivity-type-doped semiconductor region 34 compared to a standard complementary metal-oxide-semiconductor (CMOS) manufacturing sequence.

Figure 4:
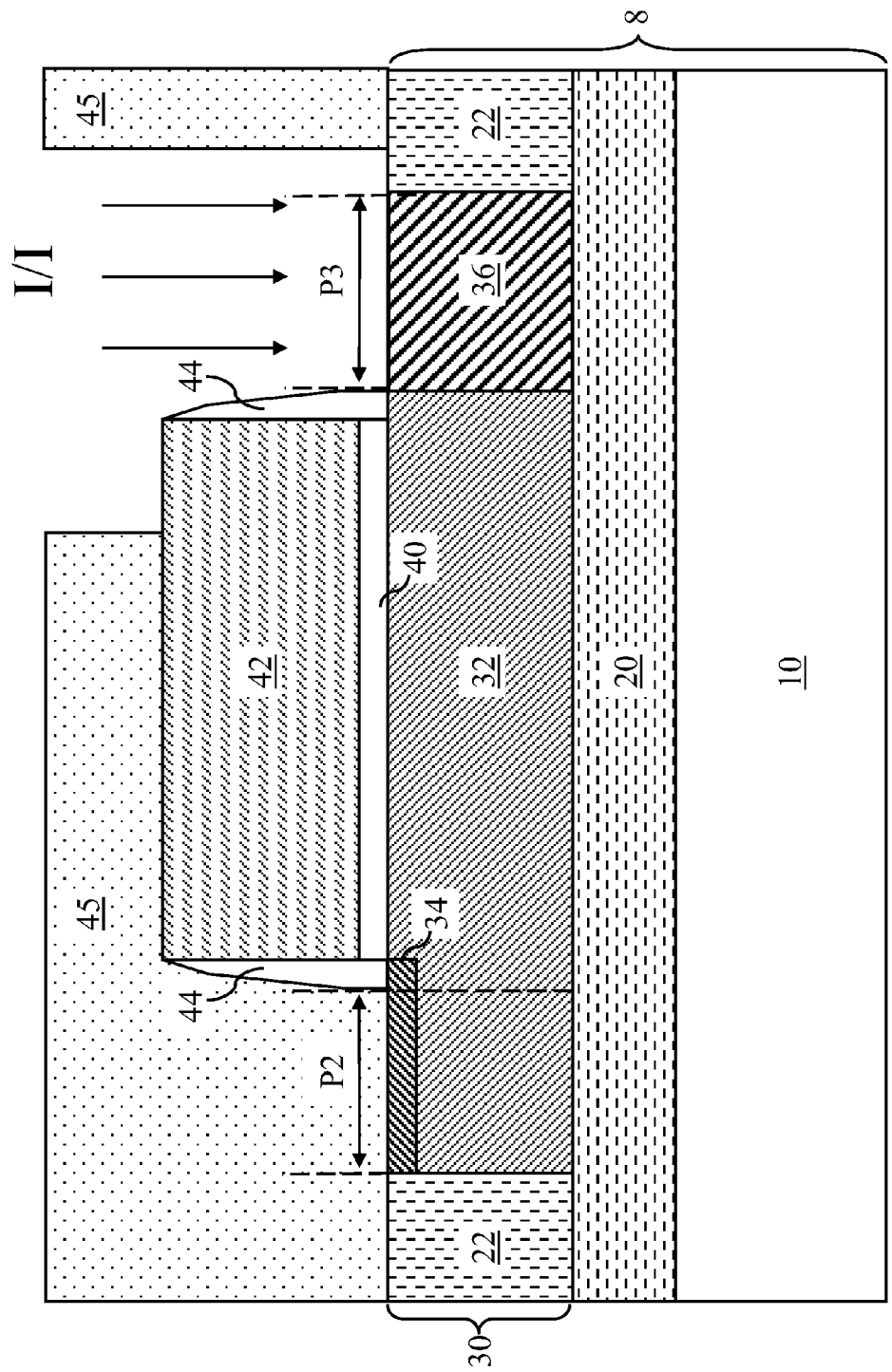

Referring to FIG. 4, a second photoresist 45 is applied over the overlying structure (40, 42, 44) and the top semiconductor layer 30, and is lithographically patterned to expose the third portion P3 of the first-conductivity-type-doped semiconductor material portion 32, while covering the second portion P2 of the first-conductivity-type-doped semiconductor material portion 32. An edge of the second photoresist 45 overlies a top surface of the overlying structure (40, 42, 44) after the lithographic patterning.

First-conductivity-type dopants are implanted into the first-conductivity-type-doped semiconductor material portion 32 by ion implantation to form a first-conductivity-type-doped semiconductor region having a doping of the first conductivity type 36 employing the second photoresist 45 and the overlying structure (40, 42, 44) as implantation masks. The entirety of the third portion P3 of the first-conductivity-type-doped semiconductor material portion 32 may become the first-conductivity-type-doped semiconductor region 36. The first-conductivity-type-doped semiconductor region 36 is formed by addition of first-conductivity-type dopants into the third portion P3 of the first-conductivity-type-doped semiconductor material portion 32. Consequently, the dopant concentration of the first-conductivity-type-doped semiconductor region 36, which is herein referred to as a second dopant concentration, is greater than the dopant concentration of the remaining portion of the first-conductivity-type-doped semiconductor material portion 32, which is the first dopant concentration. The dopant concentration of the first-conductivity-type-doped semiconductor region 36 may be from about $1.0 \times 10^{18}/cm^3$ to about $1.0 \times 10^{21}/cm^3$, and typically from about $1.0 \times 10^{19}/cm^3$ to about $5.0 \times 10^{20}/cm^3$, although lesser and greater second dopant concentrations are contemplated herein also.

The thickness of the first-conductivity-type-doped semiconductor region 36 is the same as the thickness of the top semiconductor layer 30, i.e., the first-conductivity-type-doped semiconductor material portion 32 vertically abuts the buried insulator layer 20. This may be effected by setting the energy of the ion implantation of the first-conductivity-type dopants so that the depth of ion implantation is are least equal to the thickness of the top semiconductor layer 30.

The first-conductivity-type-doped semiconductor region 36 laterally abuts the shallow trench isolation structure 22. An edge of the first-conductivity-type-doped semiconductor region 36 may be self-aligned to an outer sidewall of the overlying structure (40, 42, 44). In case the overlying structure (40, 42, 44) includes a vertical stack of the gate dielectric 40 and the gate conductor portion 42, the first-conductivity-type-doped semiconductor region 36 may also be self-aligned to sidewalls of the vertical stack of the gate dielectric 40 and the gate conductor portion 42 with a lateral offset, which is equal to the lateral thickness of the dielectric spacer 44. The second photoresist 45 is subsequently removed.

The formation of the first-conductivity-type-doped semiconductor region 36 may be performed simultaneously with the formation of source/drain regions for first-conductivity-type field effect transistors employing the same ion implantation step and the same implantation mask. Therefore, no additional ion implantation step is required for formation of the first-conductivity-type-doped semiconductor region 36 compared to a standard complementary metal-oxide-semiconductor (CMOS) manufacturing sequence.

Figure 5A:
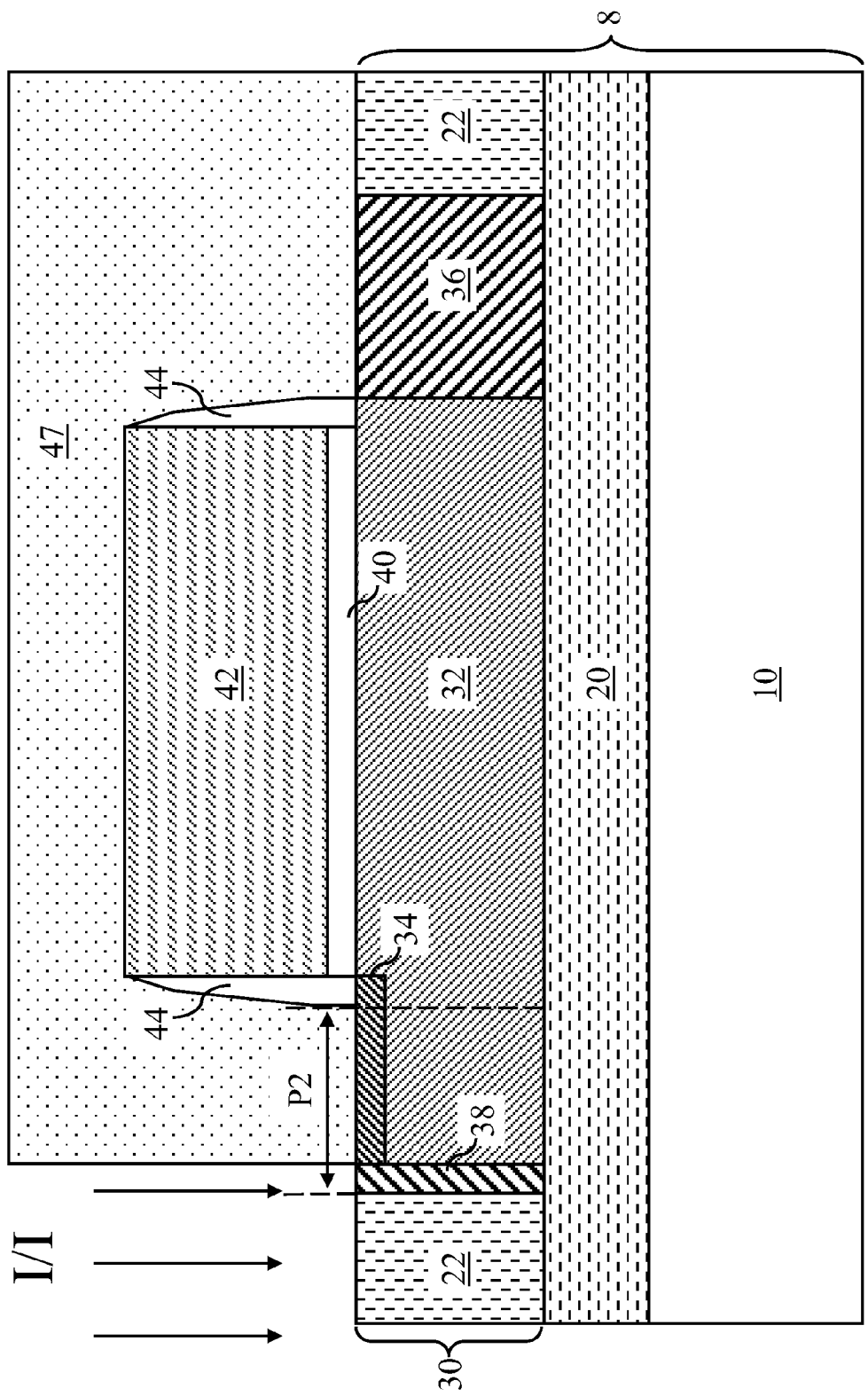
Figure 5B:
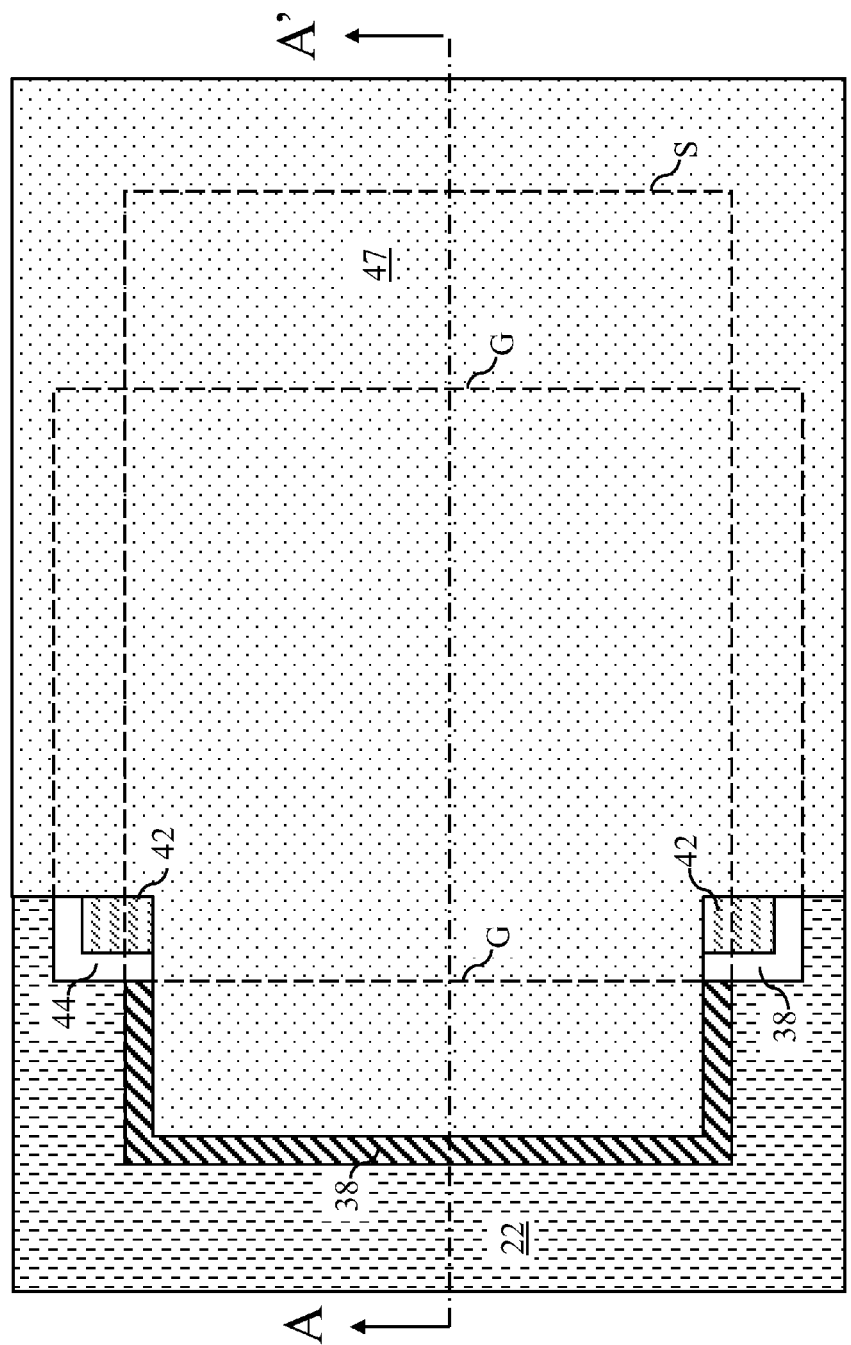
FIG. 5B is a top-down view of the first exemplary semiconductor structure at the step corresponding to FIG. 5A.

Referring to FIGS. 5A and 5B, a third photoresist 47 is applied over the top semiconductor layer 30 and the overlying structure (40, 42, 44) and lithographically patterned to expose an entirety of edges of the second portion P2 of the first-conductivity-type-doped semiconductor material portion 32 that laterally abut the shallow trench isolation structure 22. Second-conductivity-type dopants are implanted into the exposed portion of the first-conductivity-type-doped semiconductor material portion 32 to form a shallow trench isolation side (STI-side) second-conductivity-type-doped semiconductor region 38 having a doping of the second conductivity type. The second conductivity type is the opposite of the first conductivity type. The STI-side second-conductivity-type-doped semiconductor region 38 is formed by conversion of a portion of the first-conductivity-type-doped semiconductor material portion 32 laterally abutting the shallow trench isolation structure 22 and a portion of the gate-side second-conductivity-type-doped semiconductor region 34. Specifically, the dose of the ion implantation is selected so that second-conductivity-type dopants have a higher concentration than first-conductivity-type dopants in the STI-side second-conductivity-type-doped semiconductor region 38. The net dopant concentration, i.e., the difference between the dopant concentration of second-conductivity-type dopants and the dopant concentration of first-conductivity-type dopants, of the STI-side second-conductivity-type-doped semiconductor region 38 may be from about $1.0 \times 10^{18}/cm^3$ to about $1.0 \times 10^{21}/cm^3$, and typically from about $1.0 \times 10^{19}/cm^3$ to about $5.0 \times 10^{20}/cm^3$, although lesser and greater first dopant concentrations are contemplated herein also.

The thickness of the STI-side second-conductivity-type-doped semiconductor region 38 is the same as the thickness of the top semiconductor layer 30, the STI-side second-conductivity-type-doped semiconductor region 38 vertically abuts the buried insulator layer 20. The STI-side second-conductivity-type-doped semiconductor region 38 separates the shallow trench isolation structure 22 from the first-conductivity-type-doped semiconductor material portion 32. The STI-side second-conductivity-type-doped semiconductor region 38 is directly adjoined to, i.e., abuts, the gate-side second-conductivity-type-doped semiconductor region 34. The lateral width of the STI-side second-conductivity-type-doped semiconductor region 38 is preferably greater than the overlay tolerance of a lithographic mask employed to pattern the third photoresist, and may be from about 30 nm to about 300 nm, and typically from about 50 nm to about 150 nm, although lesser and greater widths are also contemplated herein. The third photoresist 47 is subsequently removed.

The formation of the STI-side second-conductivity-type-doped semiconductor region 38 may be performed simultaneously with the formation of source/drain regions for second-conductivity-type field effect transistors employing the same ion implantation step and the same implantation mask. Therefore, no additional ion implantation step is required for formation of the STI-side second-conductivity-type-doped semiconductor region 38 compared to a standard complementary metal-oxide-semiconductor (CMOS) manufacturing sequence.

Figure 6:
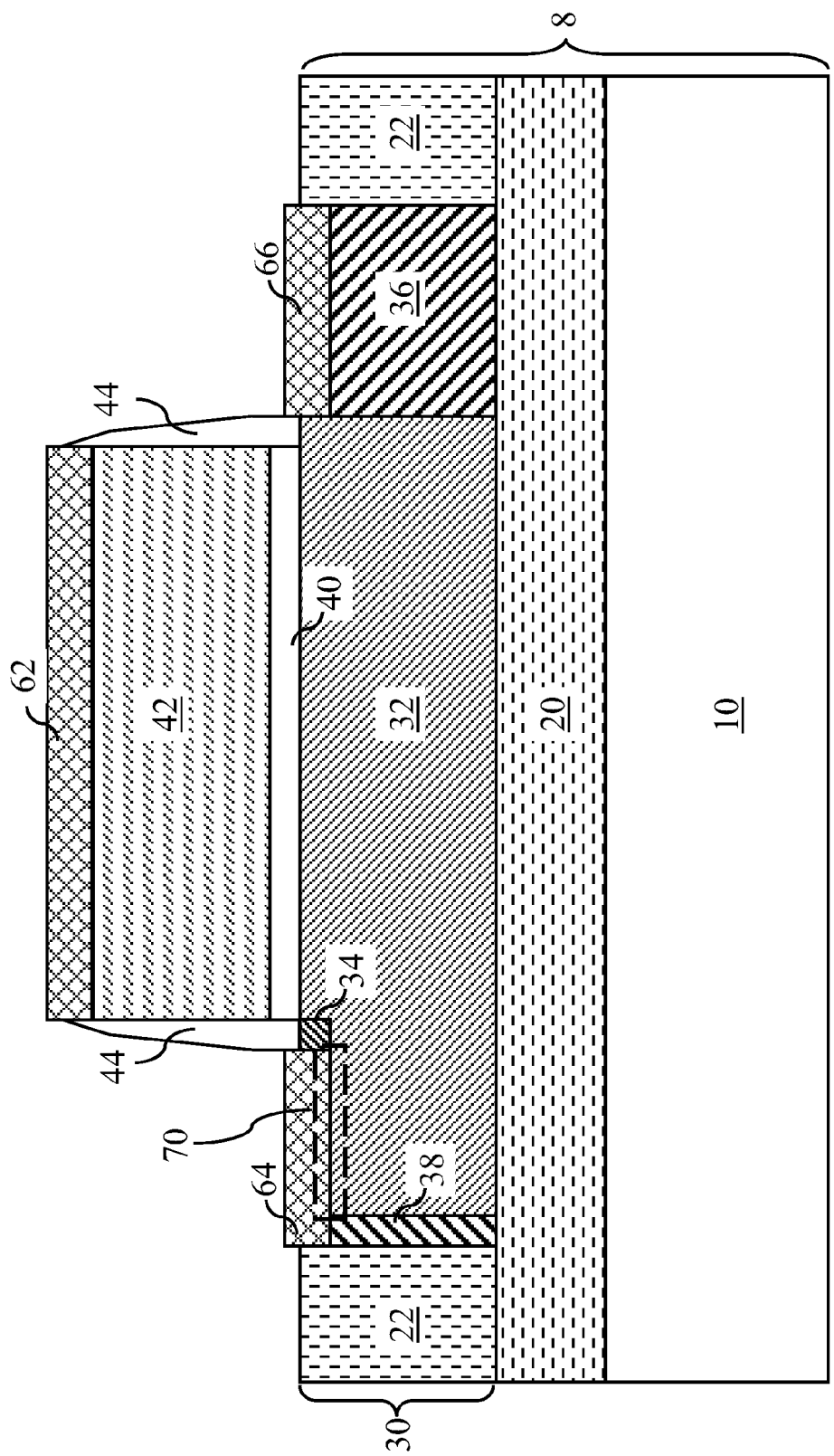

Referring to FIG. 6, metal semiconductor alloy regions are formed by applying and reacting a metal layer with exposed semiconductor materials. Unreacted portions of the metal layer are subsequently removed. Specifically, a first metal semiconductor alloy portion 64 is formed by converting exposed portions of the gate-side second-conductivity-type-doped semiconductor region 34 and the STI-side second-conductivity-type-doped semiconductor region 38 to a depth that is at least equal to the thickness of the gate-side second-conductivity-type-doped semiconductor region 34. Thus, the first metal semiconductor alloy portion 64 vertically abuts a portion of the first-conductivity-type-doped semiconductor material portion 32 to form a horizontal Schottky barrier 70. In other words, the metal semiconductor alloy material of the first metal semiconductor alloy portion 64 directly contacts a first-conductivity-type-doped semiconductor material in the first-conductivity-type-doped semiconductor material portion 32 to form the Schottky barrier having a horizontal junction surface. The horizontal Schottky barrier 70 provides rectifying electrical characteristics allowing current from the first metal semiconductor alloy portion 64 to the first-conductivity-type-doped semiconductor material portion 32, while preventing flow of current from the first-conductivity-type-doped semiconductor material portion 32 to the first metal semiconductor alloy portion 64.

A second metal semiconductor alloy portion 66 is formed by converting a top portion of the first-conductivity-type-doped semiconductor region 36. The thickness of the second metal semiconductor alloy portion 66 is substantially the same as the thickness of the first metal semiconductor alloy portion 64. The second metal semiconductor alloy portion 66 vertically abuts a remaining portion of the first-conductivity-type-doped semiconductor region 36. The second metal semiconductor alloy portion 66 provides electrical contact to the first-conductivity-type-doped semiconductor region 36. While electrical conduction across the interface between the second metal semiconductor alloy portion 66 and the first-conductivity-type-doped semiconductor region 36 is bidirectional, the current conduction is limited by the unidirectional nature of current flow across the horizontal Schottky barrier 70.

In addition, a gate metal semiconductor alloy portion 62 may be formed directly on the gate conductor portion 42 if the gate conductor portion 42 includes a semiconductor material. The various metal semiconductor alloys (62, 64, 66) include an alloy of a metal and a semiconductor material of the gate-side second-conductivity-type-doped semiconductor region 34, the STI-side second-conductivity-type-doped semiconductor region 38, the first-conductivity-type-doped semiconductor region 36, or the gate conductor portion 42. For example, if the semiconductor material from which the various metal semiconductor alloys (62, 64, 66) are derived include silicon or germanium, the various metal semiconductor alloys (62, 64, 66) include a silicide or a germanide.

The first metal semiconductor alloy portion 64 is laterally abutted by and laterally surrounded by the gate-side second-conductivity-type-doped semiconductor region 34 and the shallow trench isolation structure 22. The first metal semiconductor alloy portion 64 is vertically abutted by the STI-side second-conductivity-type-doped semiconductor portion 38 and the first-conductivity-type-doped semiconductor material portion 32. Further, the gate-side second-conductivity-type-doped semiconductor region 34 adjoins the STI-side second-conductivity-type-doped semiconductor portion 38. Thus, a circumference of the metal semiconductor alloy portion 64 is contiguously abutted by and surrounded by the gate-side second-conductivity-type-doped semiconductor region 34 and the STI-side second-conductivity-type-doped semiconductor portion 38.

The gate-side second-conductivity-type-doped semiconductor region 34 and the STI-side second-conductivity-type-doped semiconductor portion 38 also continuously abut edges of the horizontal Schottky barrier 70. Thus, all edges of the horizontal Schottky barrier 70 are directly adjoined by the gate-side second-conductivity-type-doped semiconductor region 34 or the STI-side second-conductivity-type-doped semiconductor portion 38, which has the advantageous effect of reducing reverse leakage current of the horizontal Schottky barrier 70, and thereby enhancing the unidirectionality of the rectifiction characteristics of a Schottly barrier diode that includes the first metal semiconductor alloy portion 64 and the first-conductivity-type-doped semiconductor material portion 32.

Figure 7:
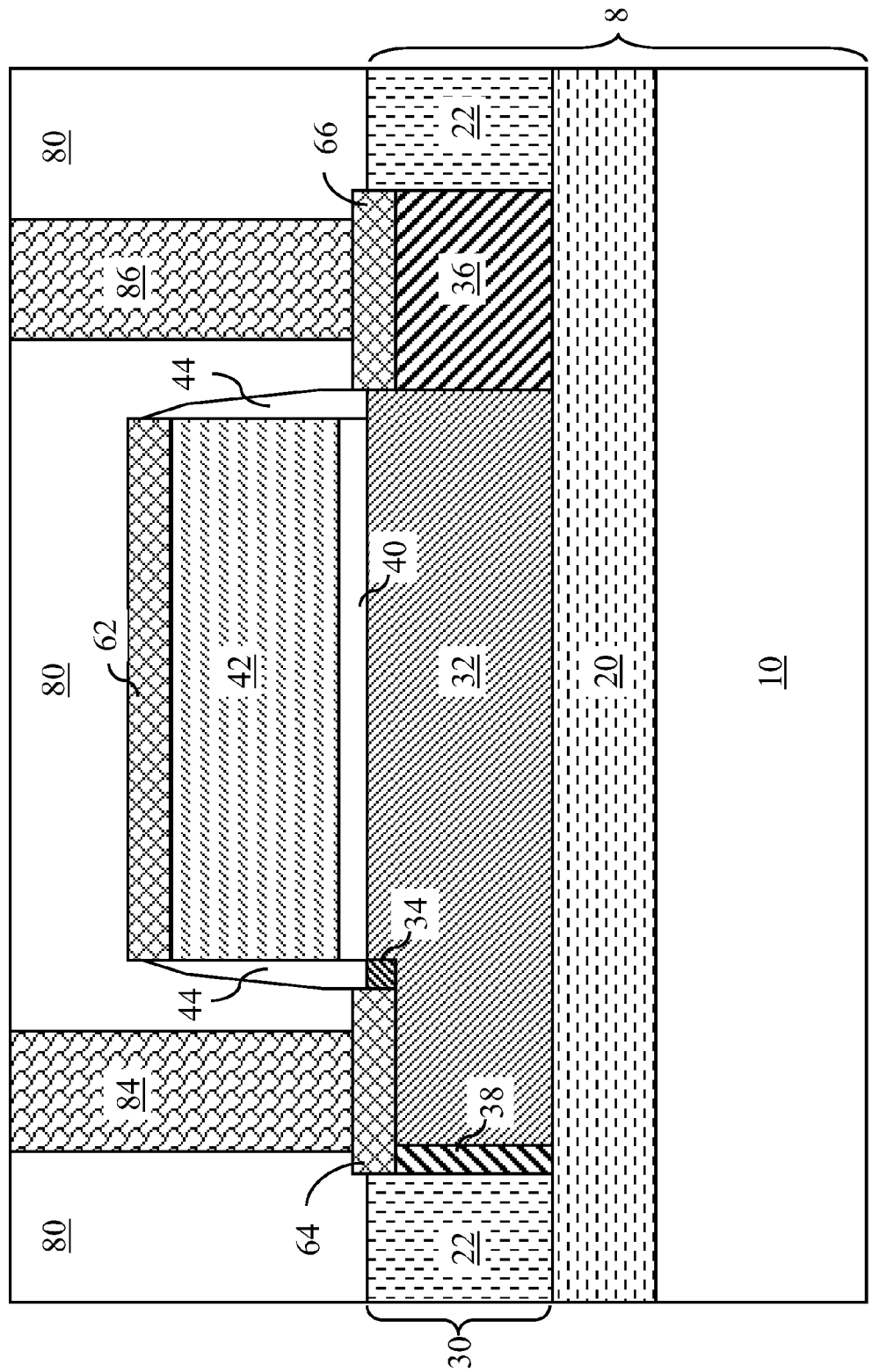

Referring to FIG. 7, a middle-of-line (MOL) dielectric layer 80 is formed on the various metal semiconductor alloy portions (62, 64, 66), the top semiconductor layer 30, and the overlying structure (40, 42, 44). The MOL dielectric layer 80 may include a silicon oxide, a silicon nitride, a chemical vapor deposition (CVD) low-k dielectric material, or a spin-on low-k dielectric material. Non-limiting examples of the silicon oxide include undoped silicate glass (USG), borosilicate glass (BSG), phosphosilicate glass (PSG), borophosphosilicate glass (BPSG), fluorosilicate glass (FSG), and TEOS (tetra-ethyl-ortho-silicate) oxide. The silicon nitride may be a stoichiometric nitride, or a non stoichiometric nitride applying a tensile or compressive stress to underlying structures.

Contact via holes (not shown) are formed in the MOL dielectric layer 80 and filled with metal to form various metal contacts. Specifically, a first contact via 84 abutting the first metal semiconductor alloy portion 64 and a second contact via 86 abutting the second metal semiconductor alloy portion 66 are formed in the MOL dielectric layer 80 to provide electrical connection to the Schottky barrier diode (64, 32).

Figure 8A:
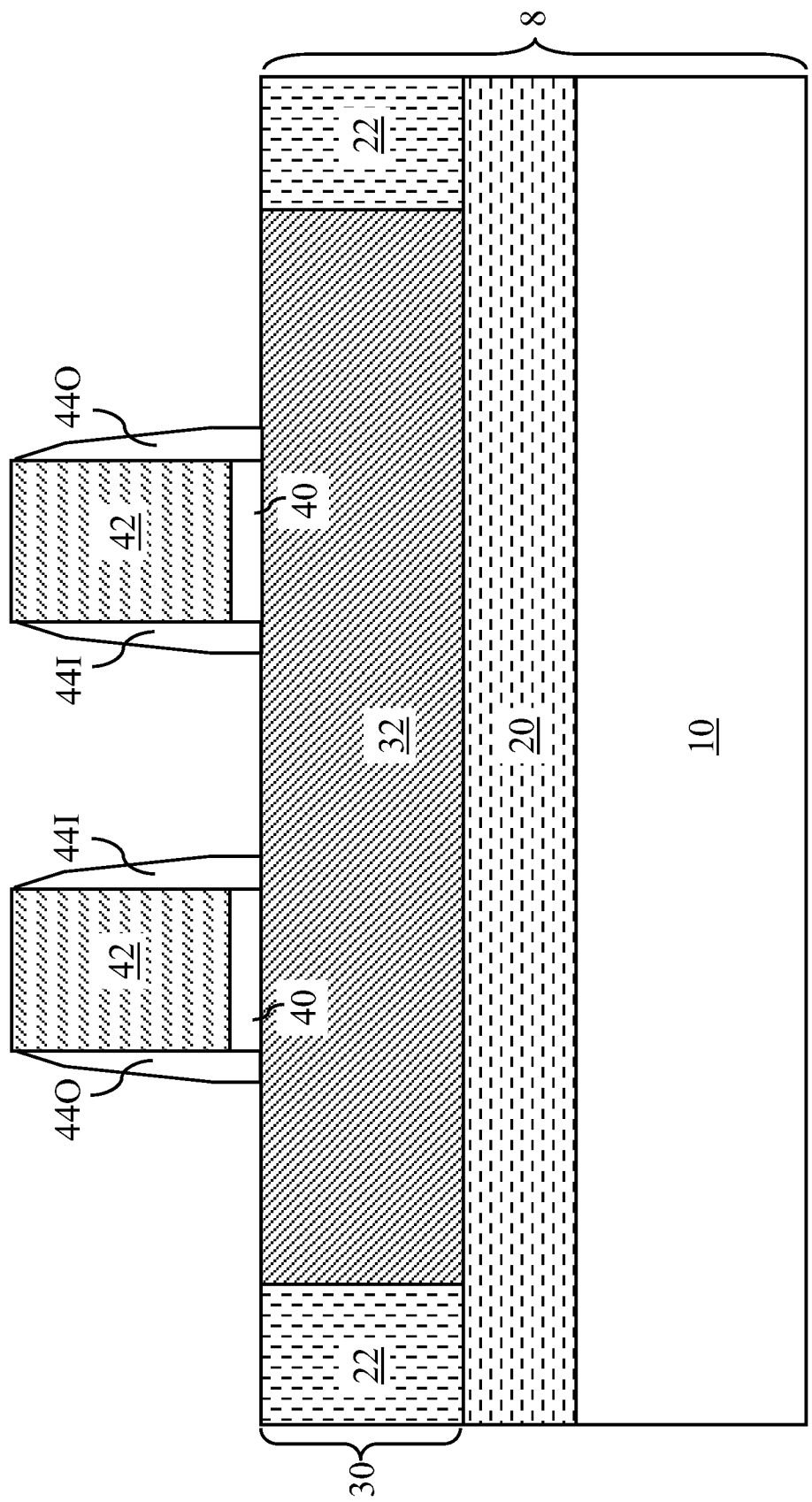
FIGS. 8A, 9A, 10A, 11A, and 12A are sequential vertical cross-sectional views of a second exemplary semiconductor structure according to a second embodiment of the present invention.
Figure 8B:
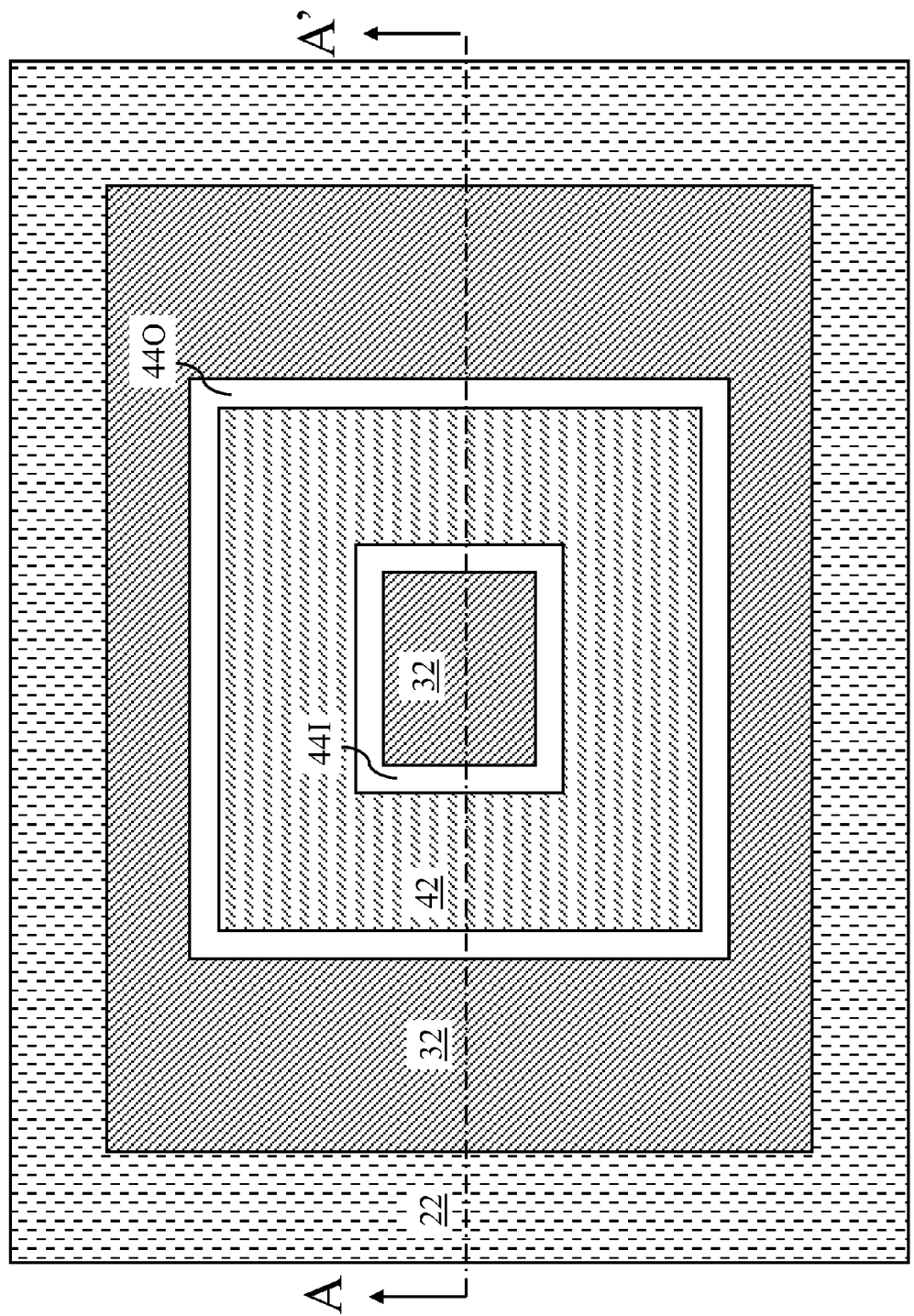
FIGS. 8B, 9B, 10B, and 11B are top-down views of the second exemplary semiconductor structure at the steps corresponding to FIGS. 8A, 9A, 10A, and 11A, respectively.

Referring to FIGS. 8A and 8B, a second exemplary semiconductor structure according to a second embodiment of the present invention includes a semiconductor substrate 8 and an overlying structure. The semiconductor substrate 8 includes a handle substrate 10, a buried insulator layer 20, and a top semiconductor layer 30 including an first-conductivity-type-doped semiconductor material portion 32 and a shallow trench isolation structure 22 as in the first embodiment of the present invention. The dopant concentration of the first-conductivity-type-doped semiconductor material portion 32, which is herein referred to as a first concentration, may be substantially the same as in the first embodiment.

The overlying structure includes a vertical stack of a gate dielectric 40 and a gate conductor portion 42, which are formed with a hole in the middle. The gate dielectric 40 and the gate conductor portion 42 may include the same material and may have the same thicknesses as in the first embodiment. Conformal deposition of a dielectric layer and a reactive ion etch results in formation of an inner dielectric spacer 44I and an outer dielectric spacer 44O. The inner dielectric spacer 44I is of unitary construction, i.e., in one integral piece. The vertical stack of the gate dielectric 40 and the gate conductor portion 42 laterally abuts and laterally surrounds the inner dielectric spacer 44I. The outer dielectric spacer 44O is of unitary construction and laterally abuts and laterally surrounds the vertical stack of the gate dielectric 40 and the gate conductor portion 42. The gate dielectric 40, the gate conductor portion 42, the inner dielectric spacer 44I, and the outer dielectric spacer 44O collectively constitute an overlying structure. The overlying structure (40, 42, 44I, 44O) is ring-shaped, i.e., topologically homeomorphic to a torus, i.e., may be continuously stretched into the shape of the torus without introducing or eliminating any topological singularity.

Figure 9A:
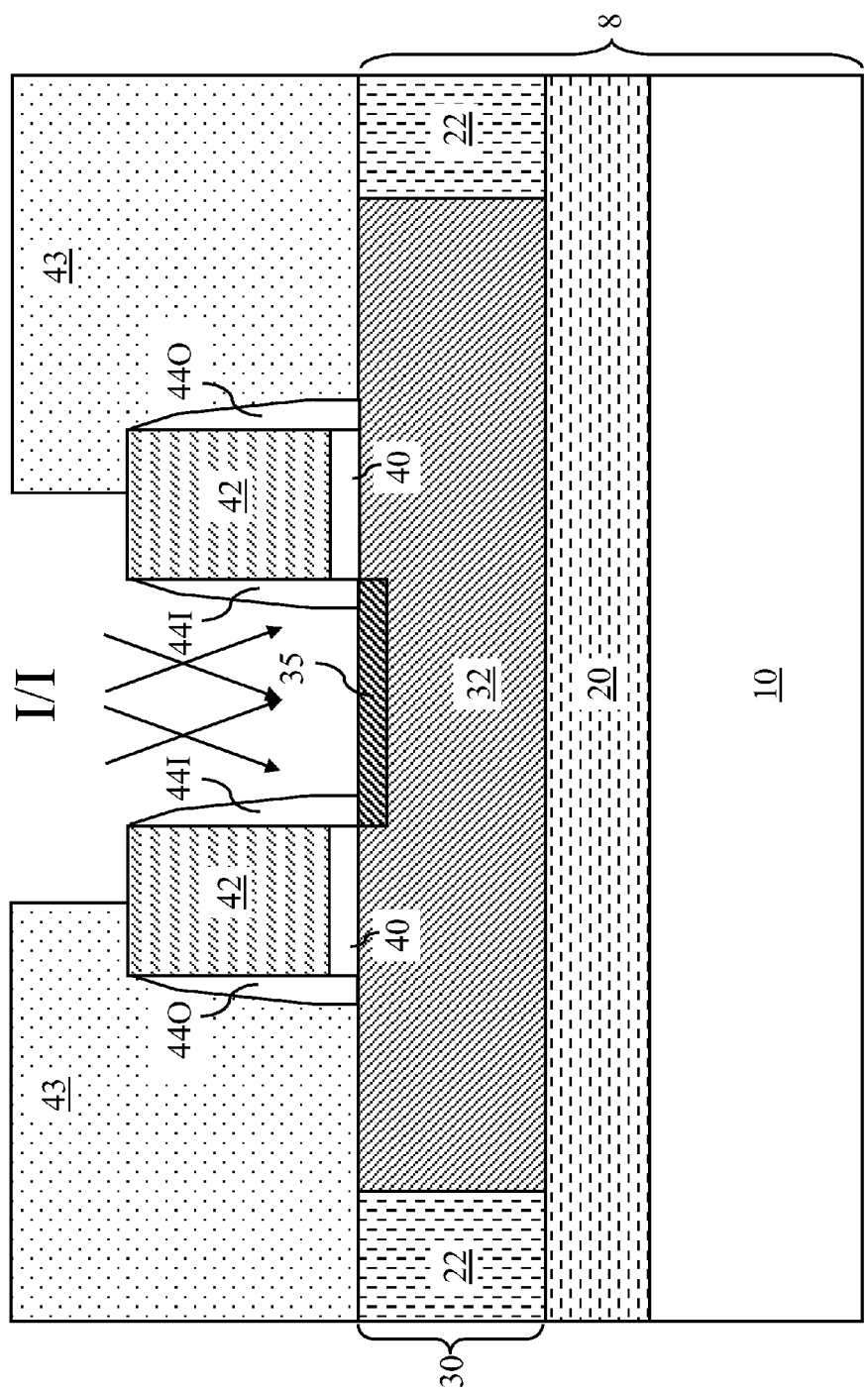
Figure 9B:
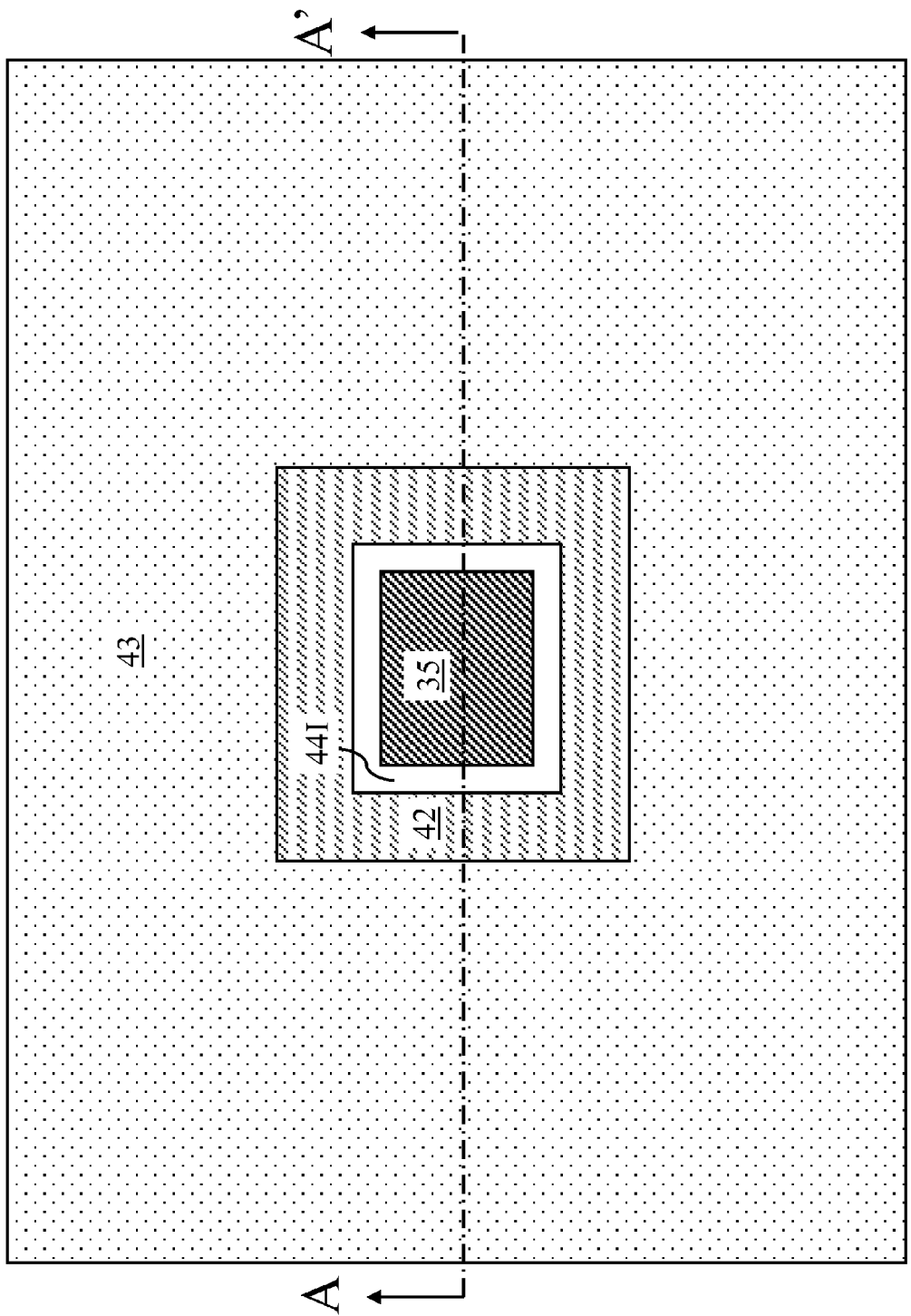

Referring to FIGS. 9A and 9B, a first photoresist 43 is applied over the overlying structure (40, 42, 44) and the top semiconductor layer 30, and is lithographically patterned to expose the hole laterally surrounded by the overlying structure (40, 42, 44I, 44O), while covering the region of the first-conductivity-type-doped semiconductor material portion 32 located outside the overlying structure (40, 42, 44I, 44O). An edge of the first photoresist 43 overlies a top surface of the overlying structure (40, 42, 44) and forms a closed shape, such as a polygon, after the lithographic patterning.

Second-conductivity-type dopants are implanted into the first-conductivity-type-doped semiconductor material portion 32 within the hole by angled ion implantation to form a gate-side second-conductivity-type-doped semiconductor region 35 employing the first photoresist 43 and the overlying structure (40, 42, 44I, 44O) as implantation masks. A second-conductivity-type-doped semiconductor region 35 having a doping of the second conductivity type is formed by conversion of a top portion of the first-conductivity-type-doped semiconductor material portion 32 within the hole and an adjoining portion of the first-conductivity-type-doped semiconductor material portion 32 underneath an edge of the inner dielectric spacer 44I. The second conductivity type is the opposite of the first conductivity type. Specifically, the dose of the ion implantation is selected so that second conductivity type dopants have a higher concentration than first conductivity type dopants in the second-conductivity-type-doped semiconductor region 35. The net dopant concentration, i.e., the difference between the dopant concentration of the second conductivity type dopants and the dopant concentration of the first conductivity type dopants, of the second-conductivitytype-doped semiconductor region 35 may be from about $1.0\times10^{18}/cm^3$ to about $1.0\times10^{21}/cm^3$, and typically from about $1.0\times10^{19}/cm^3$ to about $5.0\times10^{20}/cm^3$, although lesser and greater first dopant concentrations are contemplated herein also.

The thickness of the second-conductivity-type-doped semiconductor region 35 is less than the thickness of the top semiconductor layer 30, i.e., the thickness of the portion of the first-conductivity-type-doped semiconductor material portion 32 vertically abutting the overlying structure (40, 42, 44I, 44O). The thickness of the second-conductivity-type-doped semiconductor region 35 may be from about 5 nm to about 100 nm, and typically from about 10 nm to about 40 nm, although lesser and greater thicknesses are also contemplated herein. The second-conductivity-type-doped semiconductor region 35 of the second embodiment is a structural equivalent of the gate-side second-conductivity-type-doped semiconductor region 34 of the first embodiment.

The angle of the ion implantation is selected such that a portion of the second-conductivity-type-doped semiconductor region 35 underlies an edge portion of the overlying structure (40, 42, 44I, 44O). The area of the second-conductivity-type-doped semiconductor region 35 underlying the overlying structure (40, 42, 44I, 44O) encircles the area of the hole within the overlying structure (40, 42, 44I, 44O). The second-conductivity-type-doped semiconductor region 35 is self aligned to an outer sidewall of the overlying structure (40, 42, 44I, 44O) with a lateral offset. The lateral offset is determined by the energy of ion implantation, the angle of the ion implantation, the species of the implanted ions, etc. In case the overlying structure (40, 42, 44I, 44O) includes a vertical stack of the gate dielectric 40 and the gate conductor portion 42, the second-conductivity-type-doped semiconductor region 35 may be self-aligned to sidewalls of the vertical stack of the gate dielectric 40 and the gate conductor portion 42 with a lateral offset. The second-conductivity-type-doped semiconductor region 35 may, or may not, underlie the gate dielectric 40 depending on the lateral offset of the second-conductivity-type-doped semiconductor region 35 from the outer sidewall of the overlying structure (40, 42, 44I, 44O) or from the sidewalls of the vertical stack of the gate dielectric 40 and the gate conductor portion 42. The first photoresist 43 is subsequently removed.

The formation of the second-conductivity-type-doped semiconductor region 35 may be performed simultaneously with the formation of source/drain extension regions for second-conductivity-type field effect transistors employing the same ion implantation step and the same implantation mask. Therefore, no additional ion implantation step is required for formation of the second-conductivity-type-doped semiconductor region 35 compared to a standard complementary metal-oxide-semiconductor (CMOS) manufacturing sequence.

Figure 10A:
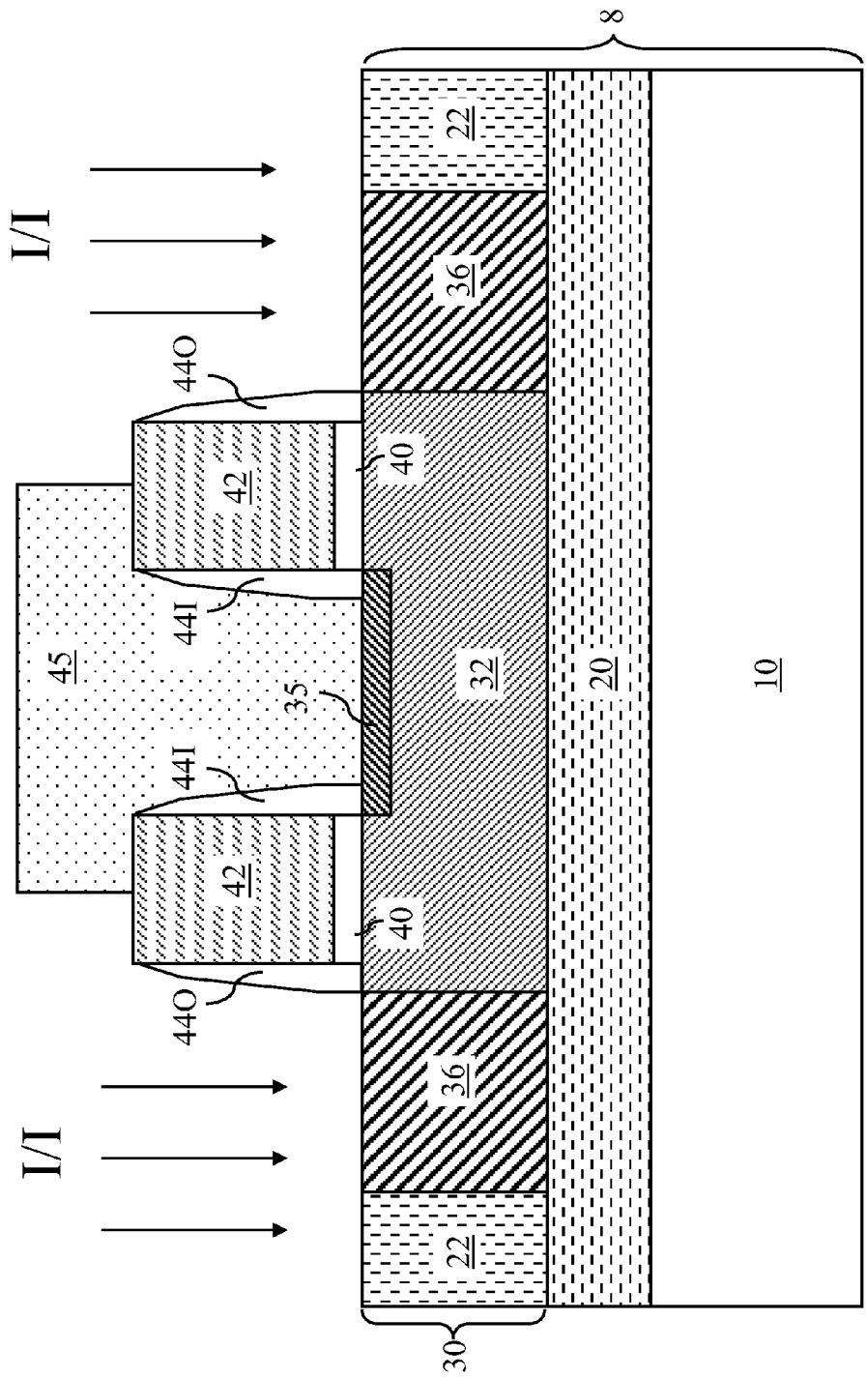
Figure 10B:
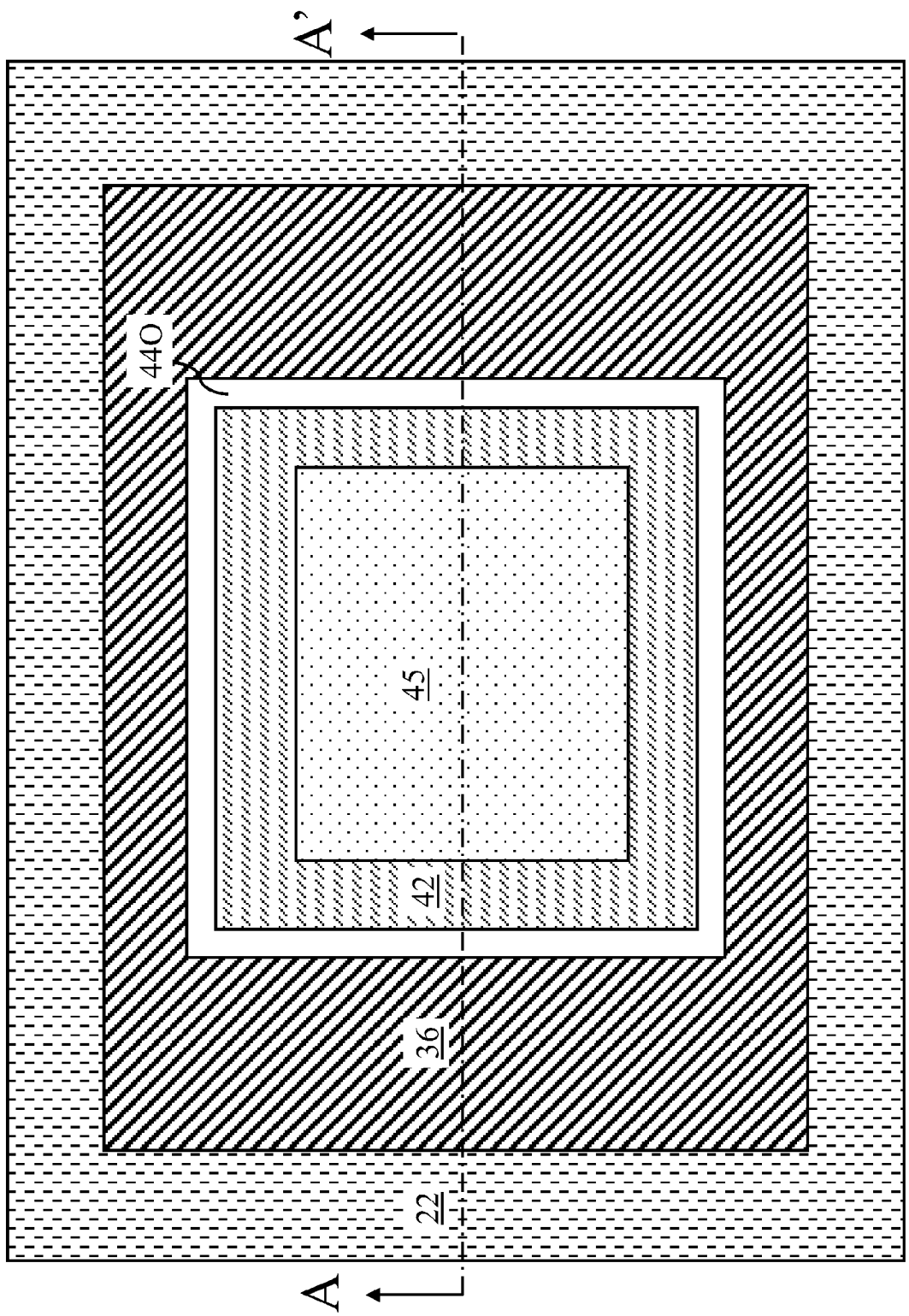

Referring to FIGS. 10A and 10B, a second photoresist 45 is applied over the overlying structure (40, 42, 44I, 44O) and the top semiconductor layer 30, and is lithographically patterned to expose the area of the first-conductivity-type-doped semiconductor material portion 32 outside the overlying structure (40, 42, 44I, 44O), while covering the second-conductivity-type-doped semiconductor region 35. An edge of the second photoresist 45 overlies a top surface of the overlying structure (40, 42, 44I, 44O) and forms a closed shape, such as a polygon, after the lithographic patterning.

First-conductivity-type dopants are implanted into the first-conductivity-type-doped semiconductor material portion 32 by ion implantation to form a first-conductivity-type-doped semiconductor region 36 having a doping of the first conductivity type by employing the second photoresist 45 and the overlying structure (40, 42, 44I, 44O) as implantation masks. The implanted portion of the first-conductivity-type-doped semiconductor material portion 32 becomes the first-conductivity-type-doped semiconductor region 36. The first-conductivity-type-doped semiconductor region 36 is formed by addition of first-conductivity-type dopants into the implanted portion of the first-conductivity-type-doped semiconductor material portion 32. Consequently, the dopant concentration of the first-conductivity-type-doped semiconductor region 36, which is herein referred to as a second dopant concentration, is greater than the dopant concentration of the remaining portion of the first-conductivity-type-doped semiconductor material portion 32, which is the first dopant concentration. The dopant concentration of the first-conductivity-type-doped semiconductor region 36 may be from about $1.0\times10^{18}/cm^3$ to about $1.0\times10^{21}/cm^3$, and typically from about $1.0\times10^{19}/cm^3$ to about $5.0\times10^{20}/cm^3$, although lesser and greater second dopant concentrations are contemplated herein also.

The thickness of the first-conductivity-type-doped semiconductor region 36 is the same as the thickness of the top semiconductor layer 30, i.e., the first-conductivity-type-doped semiconductor material portion 32 vertically abuts the buried insulator layer 20. This may be effected by setting the energy of the ion implantation of the first-conductivity-type dopants so that the depth of ion implantation is are least equal to the thickness of the top semiconductor layer 30.

The outer sidewalls of the first-conductivity-type-doped semiconductor region 36 laterally abut the shallow trench isolation structure 22. Inner edges of the first-conductivity-type-doped semiconductor region 36 may be self-aligned to an outer sidewall of the overlying structure (40, 42, 44I, 44O). In case the overlying structure (40, 42, 44I, 44O) includes a vertical stack of the gate dielectric 40 and the gate conductor portion 42, the inner edges of the first-conductivity-type-doped semiconductor region 36 may also be self-aligned to sidewalls of the vertical stack of the gate dielectric 40 and the gate conductor portion 42 with a lateral offset, which is equal to the lateral thickness of the outer dielectric spacer 44O. The first-conductivity-type-doped semiconductor region 36 is ring-shaped, i.e., topologically homeomorphic to a torus. The second photoresist 45 is subsequently removed.

The formation of the first-conductivity-type-doped semiconductor region 36 may be performed simultaneously with the formation of source/drain regions for first-conductivity-type field effect transistors employing the same ion implantation step and the same implantation mask. Therefore, no additional ion implantation step is required for formation of the first-conductivity-type-doped semiconductor region 36 compared to a standard complementary metal-oxide-semiconductor (CMOS) manufacturing sequence.

Figure 11A:
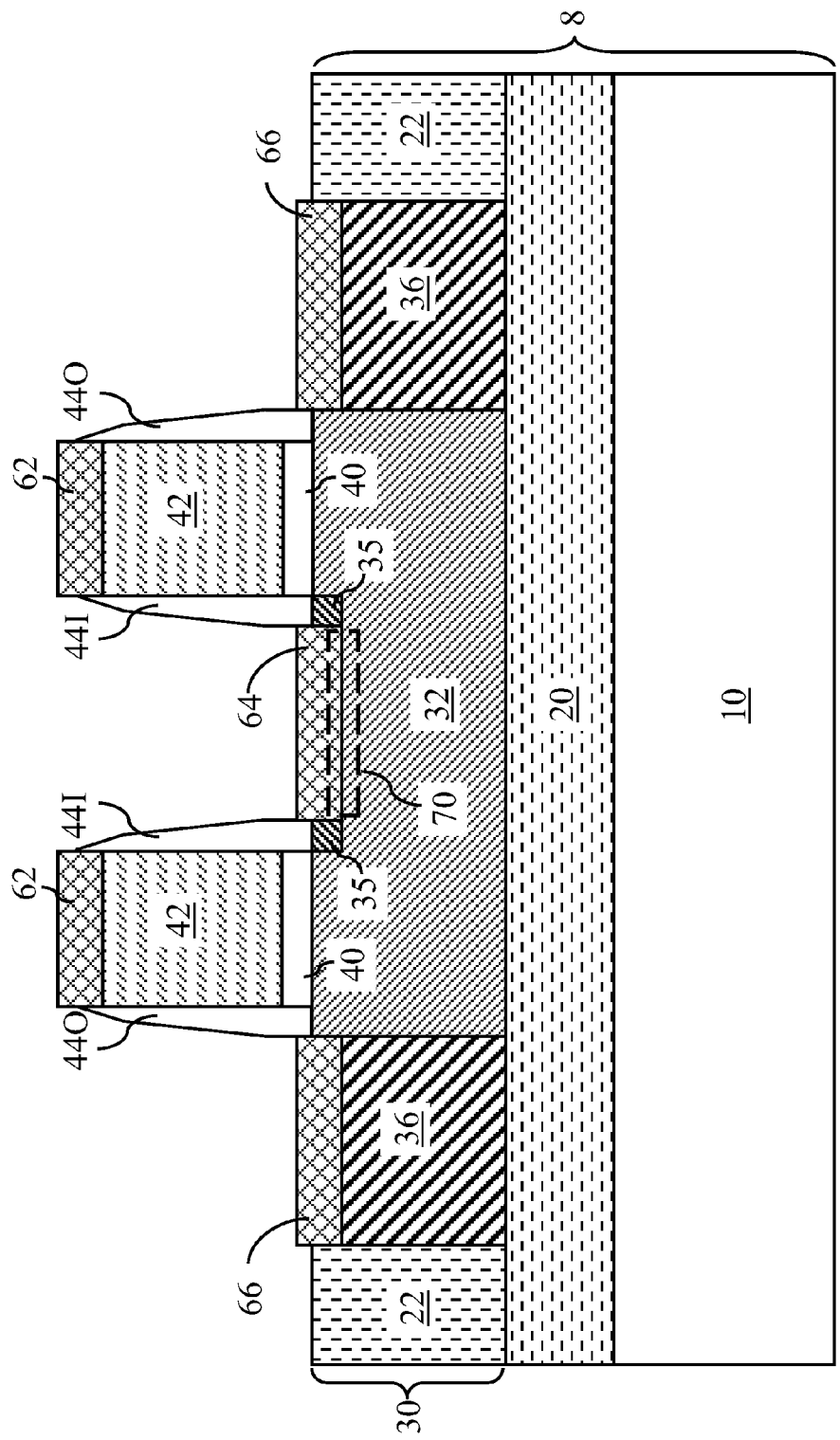
Figure 11B:
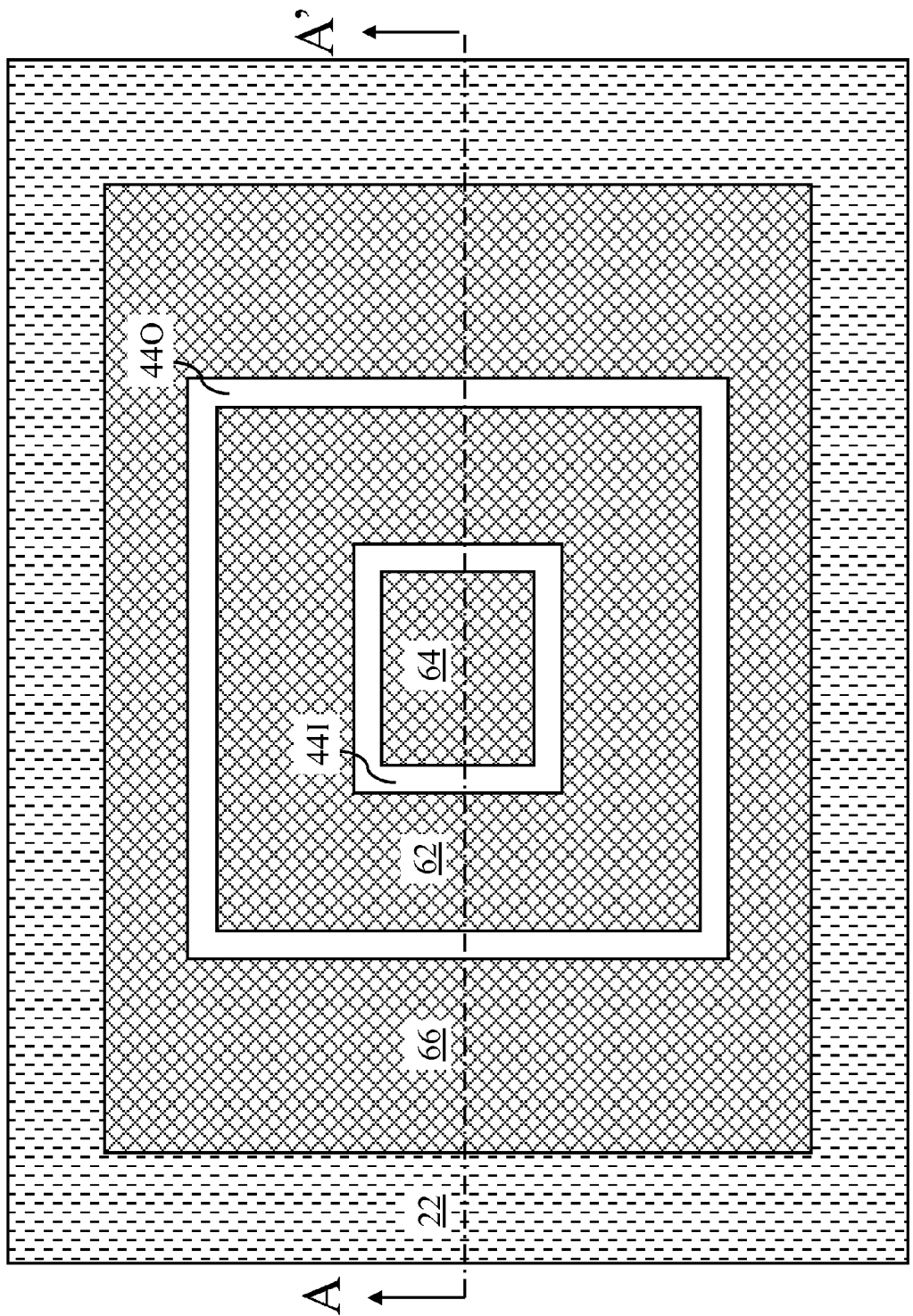

Referring to FIGS. 11A and 11B, metal semiconductor alloy regions are formed by applying and reacting a metal layer with exposed semiconductor materials in the same manner as in the first embodiment. Unreacted portions of the metal layer are subsequently removed. Specifically, a first metal semiconductor alloy portion 64 is formed by converting exposed portions of the second-conductivity-type-doped semiconductor region 35 to a depth that is at least equal to the thickness of the second-conductivity-type-doped semiconductor region 35. Thus, the first metal semiconductor alloy portion 64 vertically abuts a portion of the first-conductivity-type-doped semiconductor material portion 32 to form a horizontal Schottky barrier 70. The horizontal Schottky barrier 70 provides rectifying electrical characteristics as in the first embodiment.

A second metal semiconductor alloy portion 66 is formed by converting a top portion of the first-conductivity-type-doped semiconductor region 36 in the same manner as in the first embodiment. The second metal semiconductor alloy portion 66 is ring-shaped, i.e., topologically homeomorphic to a torus.

In addition, a gate metal semiconductor alloy portion 62 may be formed directly on the gate conductor portion 42 in the same manner as in the first embodiment.

The first metal semiconductor alloy portion 64 is laterally abutted by and laterally surrounded by the second-conductivity-type-doped semiconductor region 35. The first metal semiconductor alloy portion 64 is vertically abutted by the first-conductivity-type-doped semiconductor region 32. A circumference of the metal semiconductor alloy portion 64 is contiguously abutted by and surrounded by the second-conductivity-type-doped semiconductor region 35.

The second-conductivity-type-doped semiconductor region 35 also continuously abuts the entirety of the edges of the horizontal Schottky barrier 70. Thus, all edges of the horizontal Schottky barrier 70 is directly adjoined by the second-conductivity-type-doped semiconductor region 35, which has the advantageous effect of reducing reverse leakage current of the horizontal Schottky barrier 70, and thereby enhancing the unidirectionality of the rectifiction characteristics of a Schottly barrier diode that includes the first metal semiconductor alloy portion 64 and the first-conductivity-type-doped semiconductor region 32.

Figure 12A:
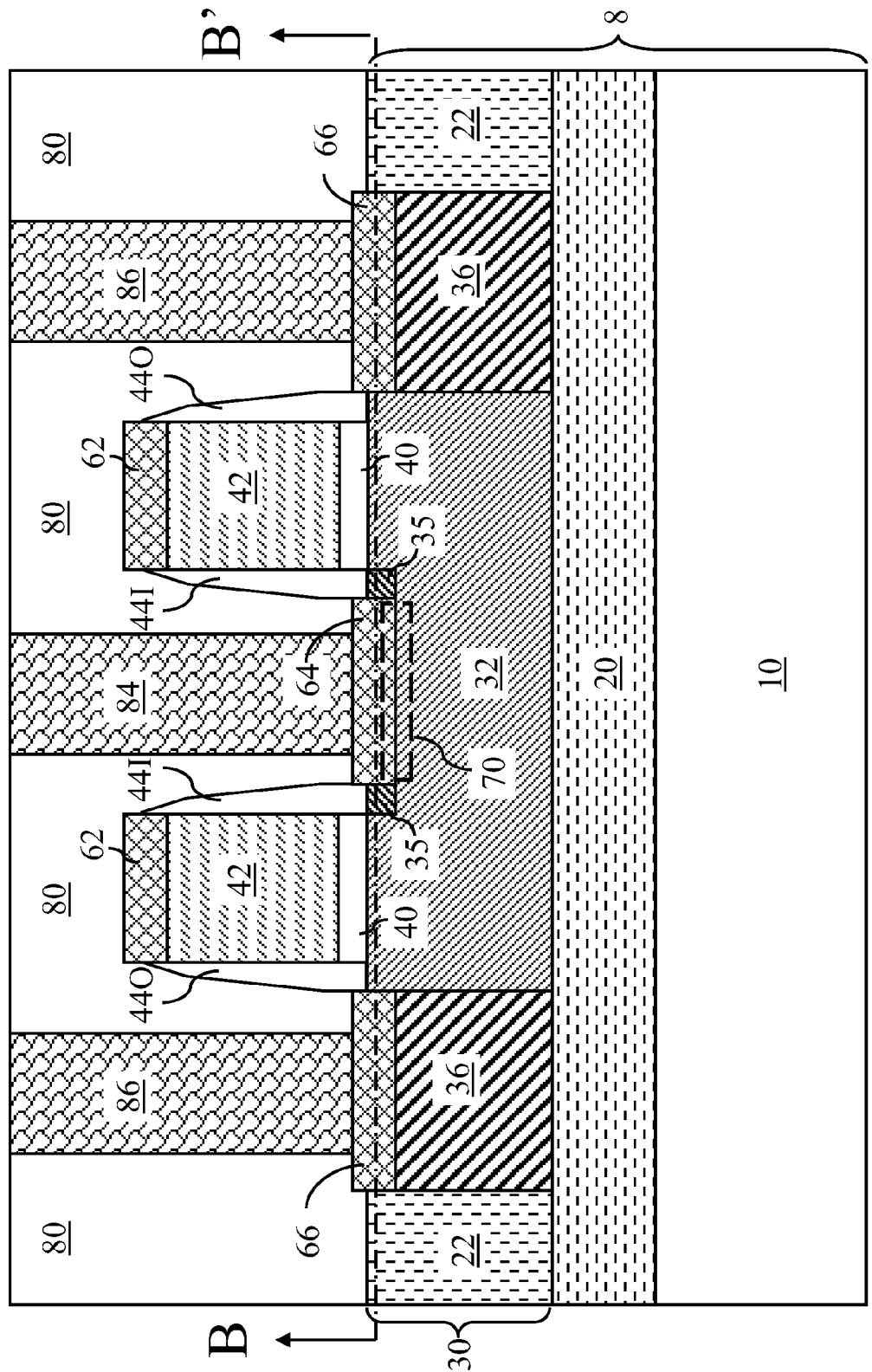
Figure 12B:
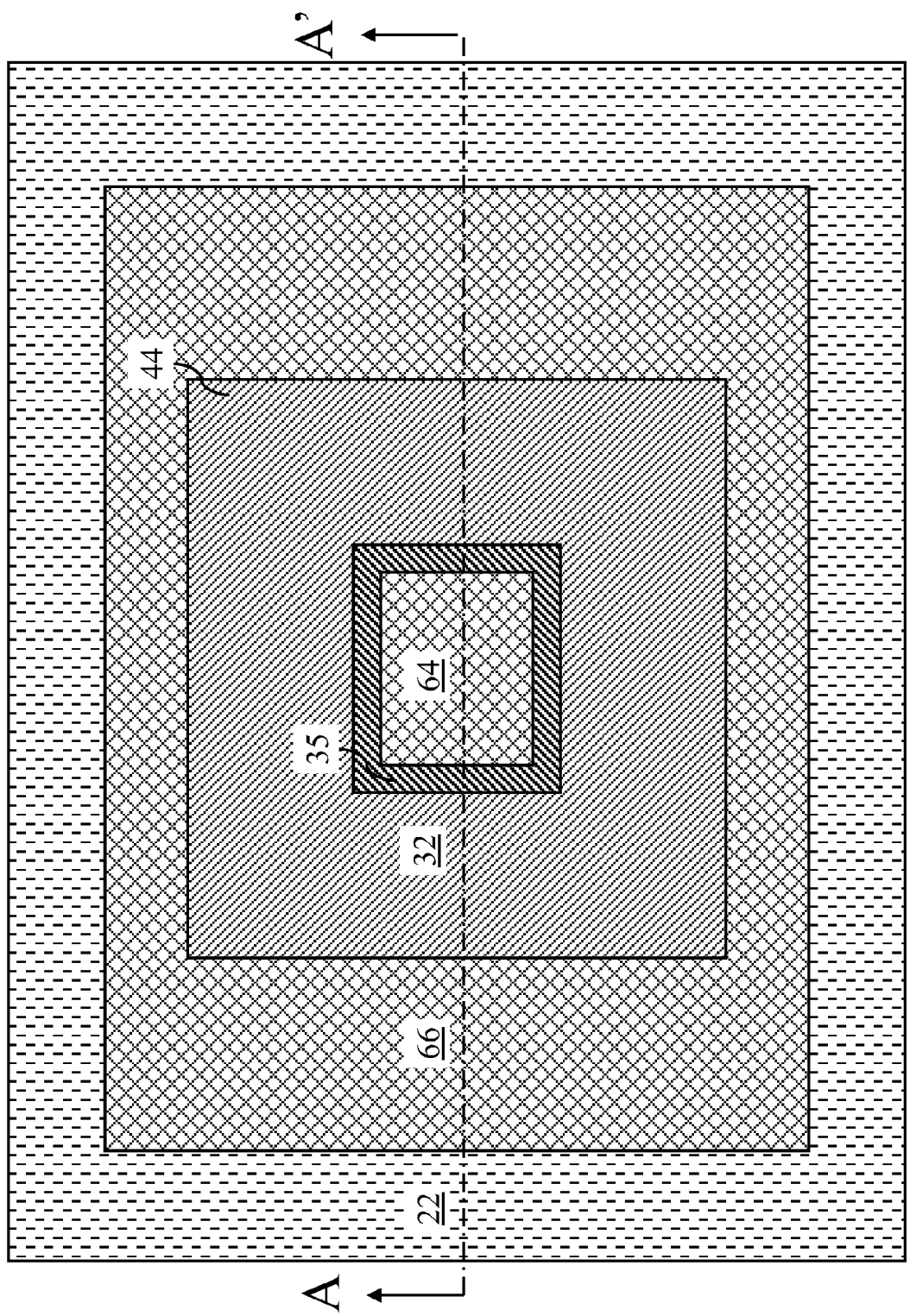
FIG. 12B is a horizontal cross-sectional view of the second exemplary semiconductor structure along the plane A-A' of FIG. 12A.

Referring to FIGS. 12A and 12B, a middle-of-line (MOL) dielectric layer 80 is formed on the various metal semiconductor alloy portions (62, 64, 66), the top semiconductor layer 30, and the overlying structure (40, 42, 44I, 44O) in the same manner as in the first embodiment. Contact via holes (not shown) are formed in the MOL dielectric layer 80 and filled with metal to form various metal contacts. Specifically, a first contact via 84 abutting the first metal semiconductor alloy portion 64 and second contact vias 86 abutting the second metal semiconductor alloy portion 66 are formed in the MOL dielectric layer 80 to provide electrical connection to the Schottky barrier diode (64, 32).

Figure 13:
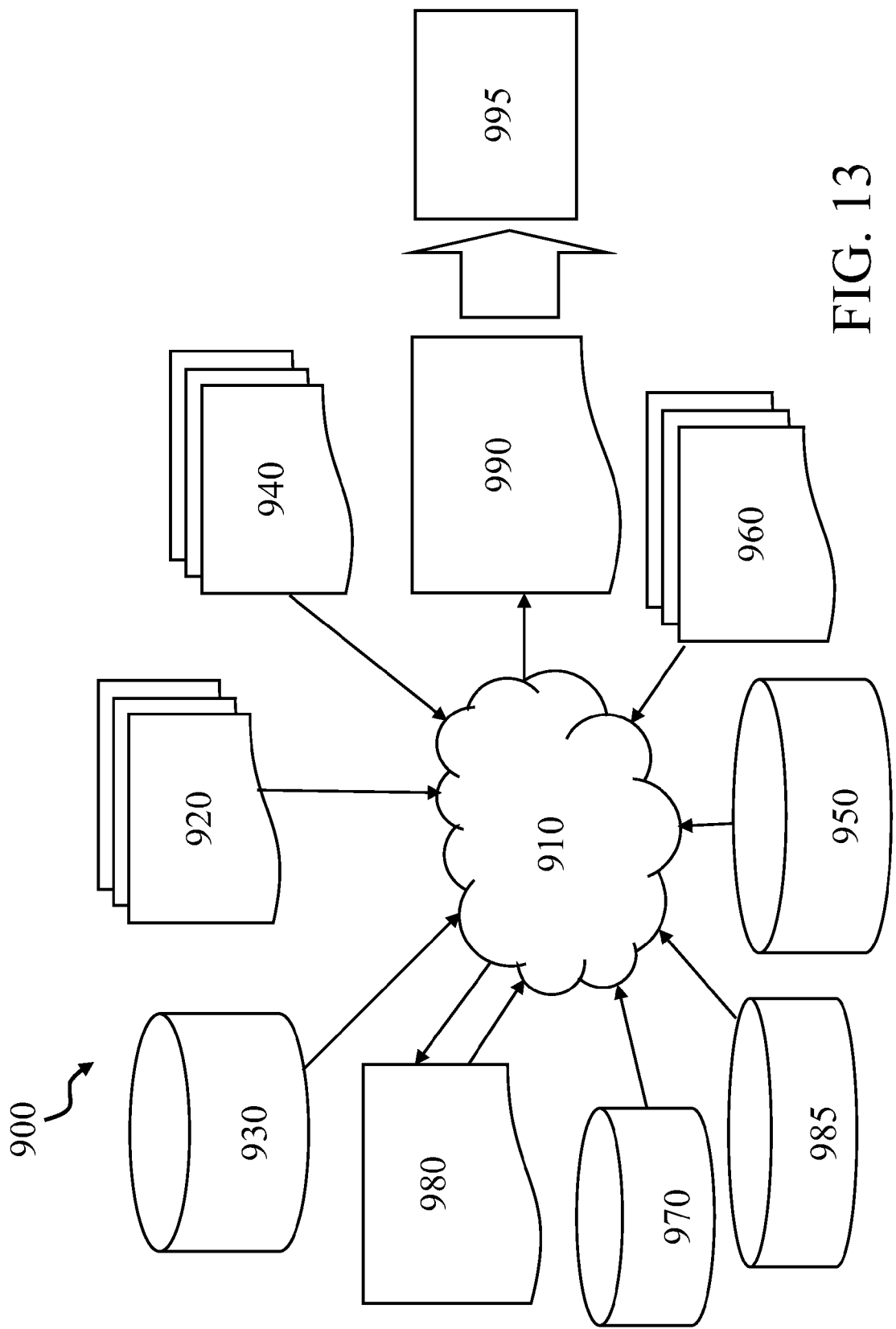
FIG. 13 is a flow diagram of a design process used in semiconductor design and manufacture of the semiconductor structures according to the present invention.

FIG. 13 shows a block diagram of an exemplary design flow 900 used for example, in semiconductor design and manufacturing of the semiconductor circuit according to the present invention. Design flow 900 may vary depending on the type of integrated circuit (IC) being designed. For example, a design flow for building an application specific integrated circuit (ASIC) may differ from a design flow for designing a standard integrated circuit component. Design structure 920 is preferably an input to a design process 910 and may come from an intellectual property (IP) provider, a core developer, or a design company, or may be generated by the operator of a design flow, or may come from other sources.

Design structure 920 includes an embodiment of present invention as shown in any of FIGS. 1-4, 5A, 5B, 6, 7, 8A-12B in the form of schematics or hardware description language (HDL; e.g. Verilog, VHDL, C, etc.) The design structure 920 may be contained on one or more machine readable medium. For example, design structure 920 may be a text file or a graphical representation of an embodiment of the invention as shown in FIGS. 1-4, 5A, 5B, 6, 7, 8A-12B.

Design process 910 preferably synthesizes (or translates) an embodiment of the invention as shown in FIGS. 1-4, 5A, 5B, 6, 7, 8A-12B into a netlist 980, where netlist 980 is, for example, a list of metal light shields, wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which the netlist 980 is resynthesized one or more times depending on design specifications and parameters for the circuit.

The design process 910 may include using a variety of inputs; for example, inputs from library elements 930 which may house a set of commonly used elements, circuits, and devices, including models, layouts, and symbolic representations, for a given manufacturing technology (e.g., different technology nodes such as 32 nm, 45 nm, and 90 nm, etc.), design specifications 940, characterization data 950, verification data 960, design rules 970, and test data files 985 (which may include, for example, standard circuit design processes such as timing analysis, verification, design rule checking, place and route operations, etc. One of ordinary skill in the art of integrated circuit design can appreciate the extent of possible electronic design automation tools and applications used in the design process 910 without deviating from the scope and spirit of the present invention. The design structure of the present invention is not limited to any specific design flow.

Design process 910 preferably translates an embodiment of the invention as shown in FIGS. 1-4, 5A, 5B, 6, 7, 8A-12B, along with any additional integrated circuit design or data (if applicable), into a second design structure 990. Design structure 990 resides on a storage medium in a data format used for the exchange of layout data of integrated circuits and/or symbolic data format (e.g., information stored in GDSII (GDS2), GL1, OASIS, map files, or any other suitable format for storing such design structures). Design structure 990 may include information such as, for example, symbolic data, map files, test data files, design content files, manufacturing data, layout parameters, wires, levels of metal, vias, shapes, data for routing though the manufacturing line, and any other data required by a semiconductor manufacturer to produce one of the embodiments of the present invention as shown in FIGS. 1-4, 5A, 5B, 6, 7, 8A-12B. Design structure 990 may then proceed to a stage 995 where, for example, design structure 990 proceeds to tape-out, is released to manufacturing, is released to a mask house, is sent to another design house, is sent back to a customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
    forming an overlying structure on a first-conductivity-type-doped semiconductor material portion;
    forming a second-conductivity-type-doped semiconductor region self-aligned to a sidewall of said overlying structure, wherein said second conductivity type is the opposite of the first conductivity type;
    forming a first-conductivity-type-doped semiconductor region contacting sidewalls of a shallow trench isolation (STI) structure and not contacting said second-conductivity-type-doped semiconductor region by implanting dopants of said first conductivity type into a portion of said first-conductivity-type-doped semiconductor material portion after formation of said overlying structure; and converting a portion of said second-conductivity-type-doped semiconductor region to a first metal semiconductor alloy portion and an upper portion of said first-conductivity-type-doped semiconductor region into a second metal semiconductor alloy portion, wherein a bottom surface of said first metal semiconductor alloy portion contacts a horizontal surface of said first-conductivity-type-doped semiconductor material portion to form a Schottky barrier, wherein a horizontal top surface of a remaining lower portion of said first-conductivity-type-doped semiconductor region contacts a bottom-most surface of said second metal semiconductor alloy portion after formation of said second metal semiconductor alloy portion.

2. The method of claim 1, wherein said first-conductivity-type-doped semiconductor region is self-aligned to another sidewall of said overlying structure, wherein said first-conductivity-type-doped semiconductor region has a greater dopant concentration than said first-conductivity-type-doped semiconductor material portion.

3. The method of claim 1, wherein said overlying structure contains a hole therein, wherein said second-conductivity-type-doped semiconductor region is formed within said hole.

4. The method of claim 3, wherein said overlying structure comprises a vertical stack of a gate dielectric and a gate conductor portion.

5. The method of claim 1, wherein said first-conductivity-type-doped semiconductor material portion is formed in a top semiconductor layer of a semiconductor-on-insulator (SOI) substrate.

6. The method of claim 1, wherein said second-conductivity-type-doped semiconductor region has a first depth and said first-conductivity-type-doped semiconductor region has a second depth that is greater than said first depth before formation of said first and second metal semiconductor alloy portions.

7. The method of claim 1, wherein no portion of said second-conductivity-type-doped semiconductor region is implanted with any dopants while said portion of said first-conductivity-type-doped semiconductor material portion is implanted with said dopants of said first conductivity type to faun said first-conductivity-type-doped semiconductor region.

8. The method of claim 1, wherein said second-conductivity-type-doped semiconductor region is formed before formation of said first-conductivity-type-doped semiconductor region.

9. The method of claim 1, wherein said first-conductivity-type-doped semiconductor region does not physically contact any region having a doping of said second conductivity type after said first-conductivity-type-doped semiconductor region and said second-conductivity-type-doped semiconductor region are formed.

10. The method of claim 1, wherein said first-conductivity-type-doped semiconductor region is laterally spaced from said second-conductivity-type-doped semiconductor region by said overlying structure.

11. The method of claim 1, wherein said first-conductivity-type-doped semiconductor region is a doped guard ring that laterally surrounds said second-conductivity-type-doped semiconductor region.

12. The method of claim 11, wherein said STI structure laterally contacts an entirety of outer sidewall of said first-conductivity-type-doped semiconductor region and laterally surrounds said first-conductivity-type-doped semiconductor region.

13. The method of claim 1, wherein said first metal semiconductor alloy portion laterally contacts and is surrounded by an unreacted remaining portion of said second-conductivity-type-doped semiconductor region.

14. A method of forming a semiconductor structure comprising:
forming an overlying structure on a first-conductivity-type-doped semiconductor material portion;
forming a gate-side second-conductivity-type-doped semiconductor region self-aligned to a sidewall of said overlying structure, wherein said second conductivity type is the opposite of the first conductivity type;
forming a shallow trench isolation-side (STI-side) second-conductivity-type-doped semiconductor region contacting sidewalls of a shallow trench isolation (STI) structure and directly adjoined to said gate-side second-conductivity-type-doped semiconductor region in said first-conductivity-type-doped semiconductor material portion, wherein said gate-side second-conductivity-type-doped semiconductor region has a first depth and said STI-side second-conductivity-type-doped semiconductor region has a second depth that is greater than said first depth; and
converting a portion of said gate-side second-conductivity-type-doped semiconductor region and a portion of said STI-side second-conductivity-type-doped semiconductor region to a metal semiconductor alloy portion, wherein said metal semiconductor alloy portion contacts said first-conductivity-type-doped semiconductor material portion to form a Schottky barrier.

15. The method of claim 14, wherein said metal semiconductor alloy portion is laterally abutted by a remaining portion of said gate-side second-conductivity-type-doped semiconductor region and vertically abutted by said remaining portion of said STI-side second-conductivity-type-doped semiconductor portion.

16. The method of claim 14, further comprising forming a first-conductivity-type-doped semiconductor region self-aligned to another sidewall of said overlying structure, wherein said first-conductivity-type-doped semiconductor region has a greater dopant concentration than said first-conductivity-type-doped semiconductor material portion.

17. The method of claim 14, wherein a circumference of said metal semiconductor alloy portion is contiguously abutted by and surrounded by a remaining portion of said gate-side second-conductivity-type-doped semiconductor region and a remaining portion of said STI-side second-conductivity-type-doped semiconductor portion.

18. The method of claim 14, wherein said first-conductivity-type-doped semiconductor material portion is formed in a top semiconductor layer of a semiconductor-on-insulator (SOI) substrate.

19. The method of claim 14, wherein said overlying structure comprises a vertical stack of a gate dielectric and a gate conductor portion.

* * * * *